United States Patent
Imoto et al.

(10) Patent No.: US 11,205,671 B2
(45) Date of Patent: Dec. 21, 2021

(54) SOLID-STATE IMAGE SENSOR AND METHOD OF MANUFACTURING THE SAME

(71) Applicant: TOPPAN PRINTING CO., LTD., Taito-ku (JP)

(72) Inventors: Tomohiro Imoto, Taito-ku (JP); Satoshi Takahashi, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 16/454,157

(22) Filed: Jun. 27, 2019

(65) Prior Publication Data
US 2019/0319058 A1 Oct. 17, 2019

Related U.S. Application Data

(63) Continuation of application No. PCT/JP2017/046173, filed on Dec. 22, 2017.

(30) Foreign Application Priority Data

Dec. 27, 2016 (JP) .............................. JP2016-253556
Dec. 27, 2016 (JP) .............................. JP2016-253650

(51) Int. Cl.
  *H01L 27/146* (2006.01)
  *G02B 5/20* (2006.01)
  *G02B 3/00* (2006.01)

(52) U.S. Cl.
  CPC ........ *H01L 27/14621* (2013.01); *G02B 5/201* (2013.01); *H01L 27/1464* (2013.01);
  (Continued)

(58) Field of Classification Search
  CPC ......... H01L 27/14621; H01L 27/14627; H01L 27/14685
  See application file for complete search history.

(56) References Cited

U.S. PATENT DOCUMENTS 9,673,239 B1 * 6/2017 Chu ................. H01L 27/14685
2004/0185588 A1 9/2004 Fukuyoshi et al.
(Continued)

FOREIGN PATENT DOCUMENTS

EP  1 959 276 A2  8/2008
EP  3 379 573 A1  9/2018
(Continued)

OTHER PUBLICATIONS

International Search Report dated Mar. 27, 2018 in PCT/JP2017/046173, filed Dec. 22, 2017, with English Translation.
(Continued)

*Primary Examiner* — Jesse Y Miyoshi
(74) *Attorney, Agent, or Firm* — Oblon, McClelland, Maier & Neustadt, L.L.P.

(57) ABSTRACT

A solid-state image sensor including a semiconductor substrate having photoelectric conversion elements being two-dimensionally formed therein, and a color filter layer formed on the semiconductor substrate and having color filters of colors being two-dimensionally formed therein in a pattern such that the color filters correspond respectively to the photoelectric conversion elements. The color filter layer satisfies formulas (1) and (2):

$$200 \leq A \leq 700 \qquad (1)$$

$$C \leq A + 200 \qquad (2)$$

where A represents a thickness in nm of a first-color color filter of a first color among the colors, and C represents a thickness in nm of color filters of colors other than the first color.

14 Claims, 16 Drawing Sheets

(52) U.S. Cl.
CPC ...... *H01L 27/14685* (2013.01); *G02B 3/0056* (2013.01); *H01L 27/14627* (2013.01)

(56) References Cited

U.S. PATENT DOCUMENTS

| | | | | |
|---|---|---|---|---|
| 2005/0103983 | A1* | 5/2005 | Yamaguchi | H01L 31/02327 250/226 |
| 2006/0158547 | A1* | 7/2006 | Komatsu | H01L 27/14623 348/340 |
| 2007/0298164 | A1* | 12/2007 | Ogata | G02B 5/201 427/162 |
| 2008/0055733 | A1* | 3/2008 | Lim | G02B 5/22 359/619 |
| 2008/0087921 | A1* | 4/2008 | Yu | H01L 27/14627 257/213 |
| 2008/0157247 | A1* | 7/2008 | Yun | H01L 27/14621 257/432 |
| 2010/0245645 | A1* | 9/2010 | Kikuchi | H01L 27/14621 348/308 |
| 2013/0100324 | A1* | 4/2013 | Ogino | H01L 27/14685 348/294 |
| 2013/0258259 | A1* | 10/2013 | Nakai | G02B 5/201 349/106 |
| 2014/0151614 | A1 | 6/2014 | Muro et al. | |
| 2014/0346629 | A1 | 11/2014 | Naya et al. | |
| 2018/0261639 | A1 | 9/2018 | Takahashi et al. | |

FOREIGN PATENT DOCUMENTS

| | | |
|---|---|---|
| JP | 11-68076 A | 3/1999 |
| JP | 2004-335598 A | 11/2004 |
| JP | 2006-222291 A | 8/2006 |
| JP | 2006-351786 A | 12/2006 |
| JP | 4857569 B2 | 1/2012 |
| JP | 4905760 B2 | 3/2012 |
| JP | 2012-118443 A | 6/2012 |
| JP | 2013-54080 A | 3/2013 |
| JP | 2013-165216 A | 8/2013 |
| WO | 2017/086321 A1 | 5/2017 |

OTHER PUBLICATIONS

Extended European Search Report dated Feb. 19, 2020 in Patent Application No. 17887913.6, 11 pages.

* cited by examiner

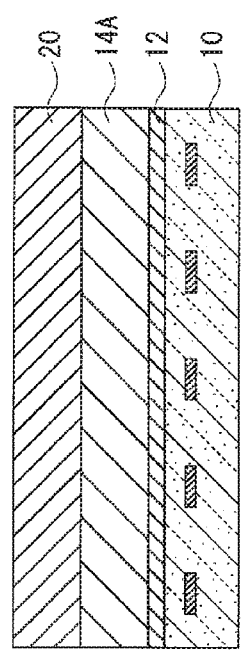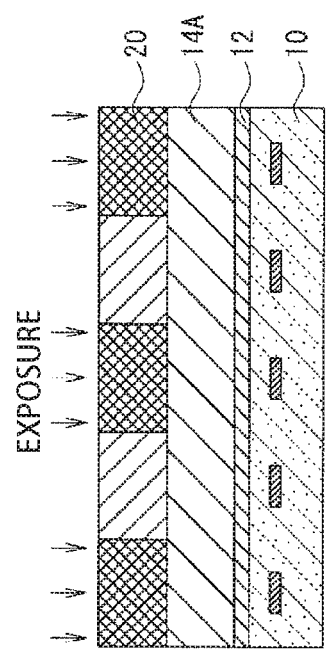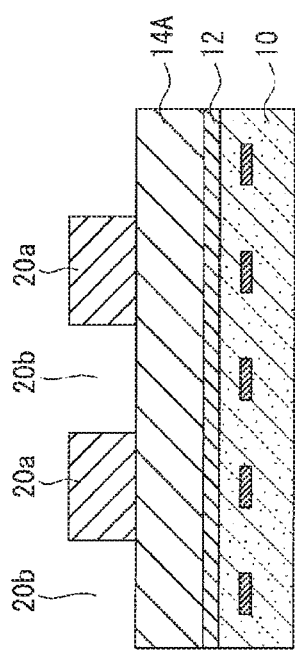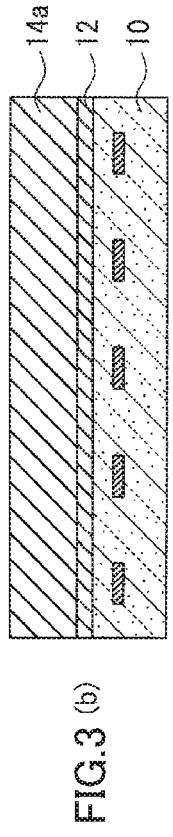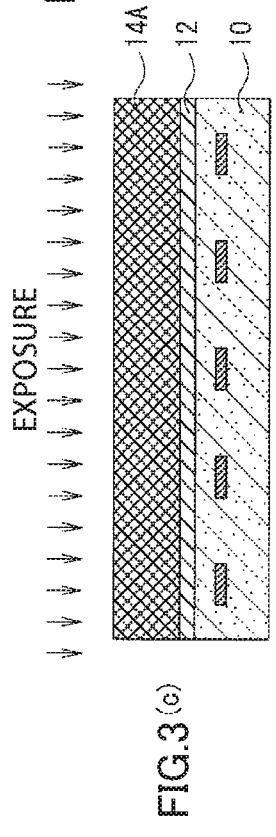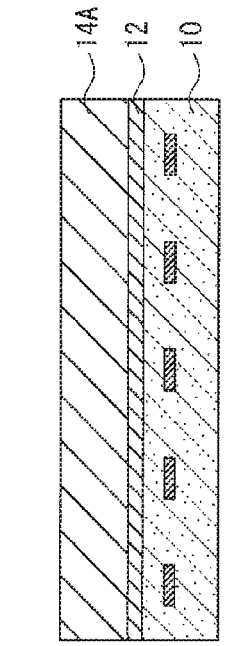
FIG.3 (a) FIG.3 (b) FIG.3 (c) FIG.3 (d) FIG.3 (e) FIG.3 (f) FIG.3 (g)

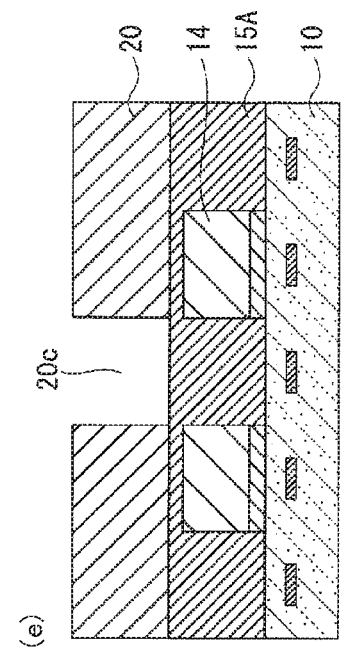
FIG.8 (a)
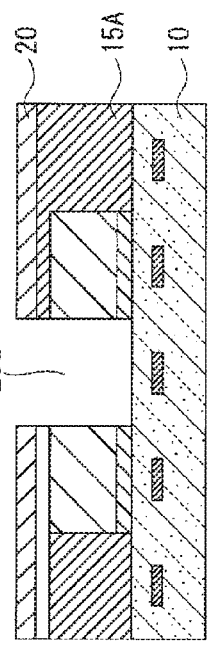
FIG.8 (b)
FIG.8 (c)
FIG.8 (d)
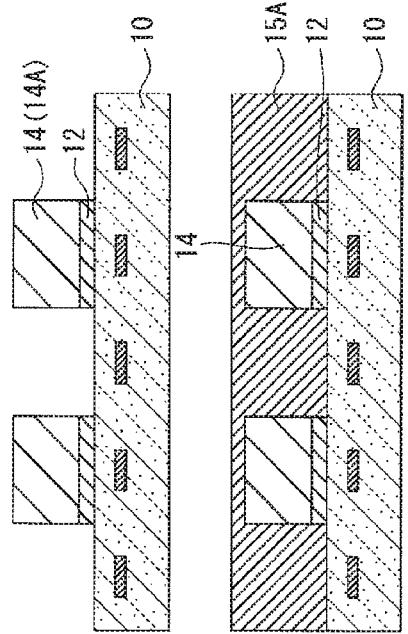
FIG.8 (e)
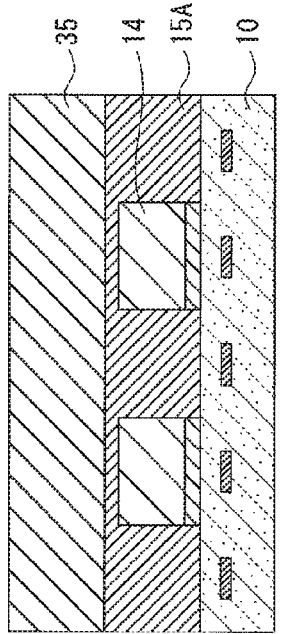
FIG.8 (f)
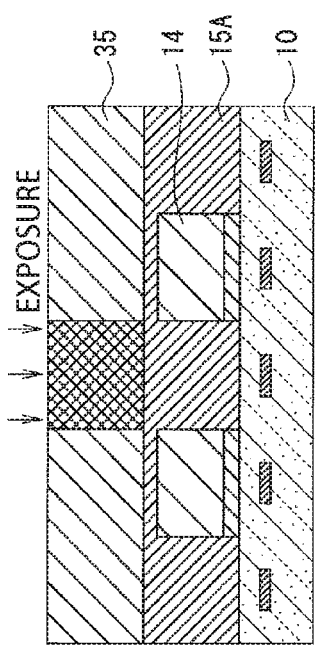
FIG.8 (g)

EXPOSURE

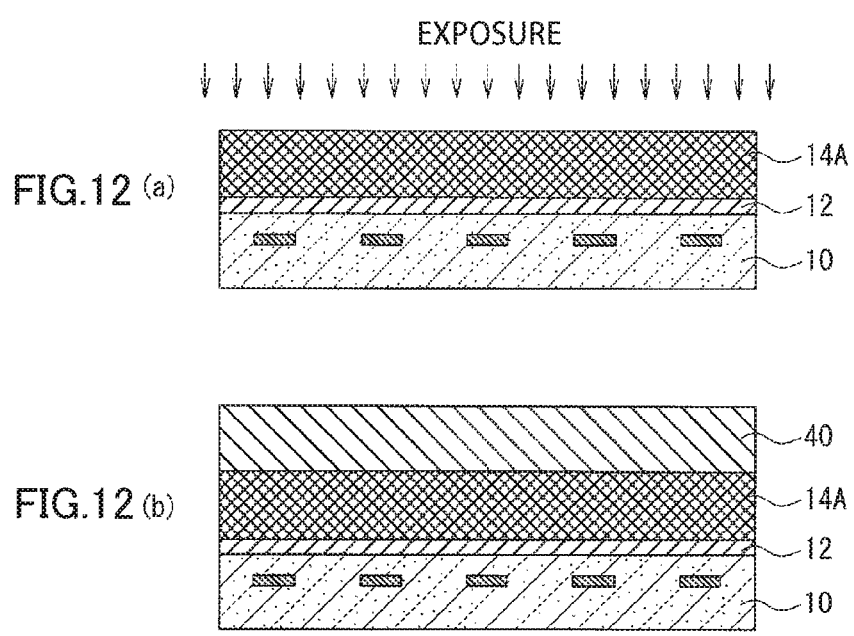

SOLID-STATE IMAGE SENSOR AND METHOD OF MANUFACTURING THE SAME

CROSS-REFERENCE TO RELATED APPLICATIONS

The present application is a continuation of International Application No. PCT/JP2017/046173, filed Dec. 22, 2017, which is based upon and claims the benefits of priority to Japanese Application No. 2016-253556, filed Dec. 27, 2016, and Japanese Application No. 2016-253650, filed Dec. 27, 2016. The entire contents of all of the above applications are incorporated herein by reference.

BACKGROUND OF THE INVENTION

Field of the Invention

The present invention is a technique related to a solid-state image sensor including photoelectric conversion elements such as a CCD or a CMOS sensor.

Discussion of the Background

In recent years, solid-state image sensors, such as a CCD (charge-coupled device) and a CMOS (complementary metal-oxide semiconductor) sensor, mounted in digital cameras and the like, have a higher number of pixels and a smaller size. Particularly small solid-state image sensors have a pixel size smaller than 1.4 µm×1.4 µm.

For color solid-state image sensors, a solid-state image sensor is provided with photoelectric conversion elements arranged in respective pixels and a color filter layer having a predetermined color pattern. A region (an opening) in which the photoelectric conversion elements contribute to photoelectric conversion depends on the size and the number of pixels of the solid-state image sensor. The opening is limited to the range of approximately 20 to 50% of a total area of the solid-state image sensor. A smaller opening directly leads to lower sensitivity of the photoelectric conversion element. In order to compensate for the lower sensitivity, therefore, the solid-state image sensor generally includes a microlens for focusing light on the photoelectric conversion element.

In recent years, image sensors with backside illumination technology have been developed, and photoelectric conversion elements having an opening of 50% or more of a total area of the solid-state image sensor have been achieved. In this case, however, light leaking from a color filter may enter an adjacent color filter, which leads to formation of a microlens having an appropriate size and shape.

As described in Patent Literature 1, a method of forming a color filter layer having a predetermined pattern is usually a method of forming color filters of respective colors by patterning by a photolithography process.

As another pattern forming method, Patent Literature 2 describes a method in which, on a solid-state image sensor, a color filter layer of a first color is formed by patterning by a dry etching process and color filter layers of second and subsequent colors are formed by patterning by a photolithography process.

Furthermore, Patent Literature 3 describes a method of forming color filters of all colors by patterning by dry etching.

In recent years, demand has increased for high-definition CCD image sensors having more than 8 million pixels. This has increased demand for high-definition CCD image sensors in which a color filter pattern accompanying such a high-definition CCD image sensor has a pixel size smaller than 1.4 µm×1.4 µm. However, a problem has occurred in which the small pixel size leads to insufficient resolution performance of the color filter layer formed by patterning by a photolithography process and this adversely affects characteristics of the solid-state image sensor. In a solid-state image sensor having a pixel size of 1.4 µm or less or of close to 1.1 µm or 0.9 µm on each side, insufficient resolution performance results in color unevenness caused by a pattern shape defect.

Furthermore, a smaller pixel size leads to a larger aspect ratio of a pattern of a color filter layer (a thickness of the pattern of the color filter layer becomes larger relative to a width of the pattern of the color filter layer). When such a color filter layer is formed by patterning by a photolithography process, a portion (an ineffective portion of a pixel) originally to be removed is not completely removed and remains as a residue, and adversely affects pixels of other colors. At this time, a problem has occurred in which when measures such as extension of development time are taken to remove the residue, cured necessary pixels are also peeled off.

In order to obtain satisfactory spectral characteristics, color filters desirably have a large thickness. When the color filters have a large thickness, however, smaller pixels tend to cause lower resolution such as rounded corners of the color filters formed by patterning. In order to obtain a color filter having a large thickness and desired spectral characteristics, a pigment concentration (a concentration of a coloring agent) in a color filter material is desired to be high. When the pigment concentration is high, however, in some cases, light necessary for a photocuring reaction does not reach a bottom of a color filter layer, and this may lead to insufficient curing of the color filter layer. This causes a problem in which the color filter layer is peeled off at a development step during photolithography, so that pixel defects occur.

When color filters are configured to have a smaller thickness, and a pigment concentration in a color filter material is increased to obtain spectral characteristics, an amount of a photocurable component is relatively reduced. This leads to insufficient photocuring of the color filter layer. Thus, shape deterioration, shape nonuniformity in a plane, shape deformation, and the like are more likely to occur. Furthermore, when an exposure amount during curing is increased to obtain sufficient photocuring, a problem of reduction in throughput occurs.

Due to a higher-definition pattern of a color filter layer, a thickness of the color filter layer not only causes a problem in the manufacturing process but also influences the characteristics of the solid-state image sensor. When the color filter layer has a large thickness, after obliquely incident light is dispersed by a color filter of a specific color, the light may enter an adjacent filter pattern portion of another color and a photoelectric conversion element below the filter pattern portion. In this case, a color mixture problem occurs. The color mixture problem becomes apparent as a pixel size becomes smaller and an aspect ratio between the pixel size defining a pattern size and the thickness of the color filter becomes larger. Furthermore, a problem regarding color mixture of incident light also becomes apparent when due to a material of a flattening layer and the like formed on a substrate in which photoelectric conversion elements are provided, a distance between a color filter pattern and the photoelectric conversion elements becomes long. Accordingly, it is important for the color filter layer, the flattening layer formed at a lower portion of the color filter layer, and the like to have a small thickness.

Thus, in order to increase the number of pixels of a solid-state image sensor, a color filter layer is desired to have a higher-definition pattern, and it is important for the color filter layer to have a smaller thickness.

As mentioned above, in the conventional pattern formation of a color filter layer formed of a photosensitive color filter material by photolithography, a smaller pixel size leads to the color filter layer of a smaller thickness. In this case, a ratio of a pigment component contained in the color filter material is increased, and thus the color filter material contains an insufficient amount of photosensitive component. This has caused problems in which no resolution performance is obtained, a residue is more likely to remain, and pixels are more likely to be peeled off. Thus, characteristics of the solid-state image sensor become deteriorated.

In order to achieve a finer and thinner pattern of a color filter layer, therefore, the techniques of Patent Literatures 2 and 3 have been proposed. In Patent Literatures 2 and 3, in order to increase a pigment concentration in a color filter material, color filters of a plurality of colors are formed by patterning by dry etching that enables patterning using a material containing no photosensitive component. These techniques using dry etching can increase a pigment concentration, and make it possible to produce a color filter pattern that achieves sufficient spectral characteristics even when the color filter pattern has a small thickness.

Patent Literature 1 JP H11-68076 A
Patent Literature 2 JP 4857569 B
Patent Literature 3 JP 4905760 B

SUMMARY OF THE INVENTION

According to an aspect of the present invention, a solid-state image sensor includes a semiconductor substrate having photoelectric conversion elements being two-dimensionally formed therein, and a color filter layer formed on the semiconductor substrate and having color filters of colors being two-dimensionally formed therein in a pattern such that the color filters correspond respectively to the photoelectric conversion elements. The color filter layer satisfies formulas (1) and (2):

$$200 \leq A \leq 700 \quad (1)$$

$$C \leq A + 200 \quad (2)$$

where A represents a thickness in nm of a first-color color filter of a first color among the colors, and C represents a thickness in nm of color filters of colors other than the first color.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3(a)-3(g) are cross-sectional views illustrating an application step for a first color filter pattern and an order of steps of opening portions where second and subsequent color filters are to be formed by using a photosensitive resin pattern material according to a first embodiment.

FIGS. 8(a)-8(g) are cross-sectional views illustrating, in order of steps, a process of producing a second-color color filter pattern by dry etching according to the first embodiment of the present invention.

FIGS. 12(a) and 12(b) are cross-sectional views illustrating, in order of steps, a process in which only photocuring is performed with respect to the first-color color filter pattern and a photosensitive resin pattern material is applied at a next step according to the third embodiment of the present invention.

DESCRIPTION OF THE EMBODIMENTS

Figure 1:
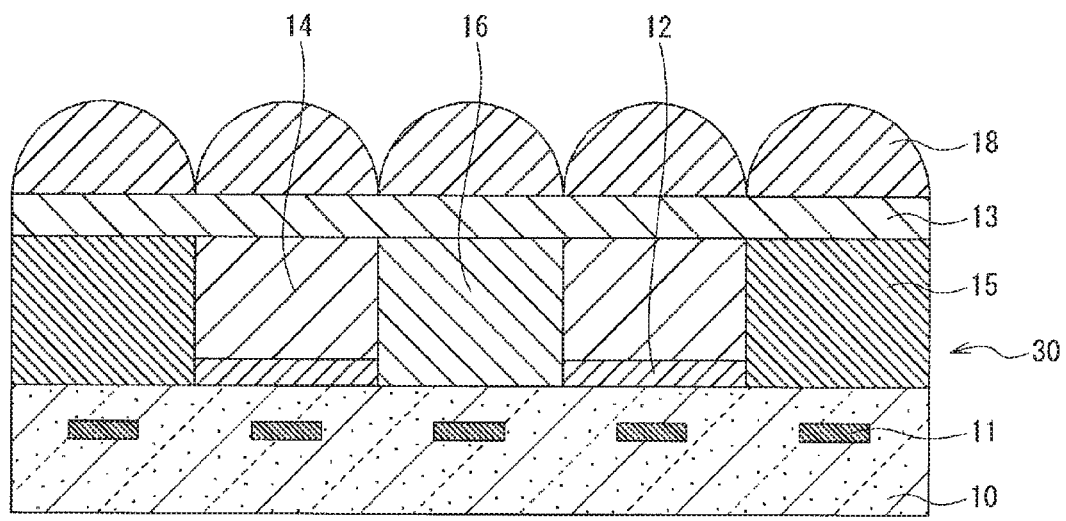
FIG. 1 is a cross-sectional view of a solid-state image sensor according to an embodiment of the present invention.

The embodiments will now be described with reference to the accompanying drawings, wherein like reference numerals designate corresponding or identical elements throughout the various drawings.

Embodiments of the present invention will be described below with reference to the drawings.

The drawings are schematic, and thus a relationship between a thickness and a planar dimension, a ratio of thicknesses of layers, and the like differ from actual values.

Furthermore, the embodiments described below show, as examples, configurations for embodying a technical idea of the present invention. The technical idea of the present invention does not specify materials, shapes, structures, and the like of components as below. Various changes may be made to the technical idea of the present invention within the technical scope of the claims.

<Configuration of Solid-State Image Sensor>

As illustrated in FIG. 1, a solid-state image sensor according to the present embodiment includes a semiconductor substrate 10 including a plurality of photoelectric conversion elements 11 that are two-dimensionally arranged, a microlens group constituted by a plurality of microlenses 18 that are arranged above the semiconductor substrate 10, and a color filter layer 30 that is provided between the semiconductor substrate 10 and the microlenses 18. The color filter layer 30 is configured such that color filters 14, 15, and 16 of a plurality of colors are arranged in a predetermined regular pattern.

In the solid-state image sensor of the present embodiment, a lower layer flattening layer 12 provided on a surface of the semiconductor substrate 10 is provided only at a lower portion of the color filter 14 that has a largest area. However, when adhesion between the semiconductor substrate 10 and the color filter 14 can be ensured in a different manner, the lower layer flattening layer 12 does not need to be provided.

Furthermore, an upper layer flattening layer 13 is provided between the color filter layer 30 and the microlens group constituted by the plurality of microlenses 18.

In the following description of the solid-state image sensor according to the present embodiment, a first color filter formed in a manufacturing process and having a largest area is defined as a first-color color filter 14 of a first color. Furthermore, a second color filter formed in the manufacturing process is defined as a second-color color filter 15 of a second color, and a third color filter formed in the manufacturing process is defined as a third-color color filter 16 of a third color. This applies to other embodiments.

In the solid-state image sensor according to the present embodiment, the first-color color filter 14 contains a thermosetting resin and a photocurable resin. The content of the photocurable resin is lower than the content of the thermosetting resin in the first-color color filter 14.

The first-color color filter 14 does not need to be a color filter having a largest area or a color filter formed first.

The present embodiment shows, as an example, a case where the color filter layer 30 is configured such that the plurality of colors are composed of three colors, i.e., green, red, and blue and the color filters are arranged in an arrangement pattern of a Bayer array. However, the color filter layer 30 may be a color filter layer constituted by color filters of four or more colors.

In the following description, the first color is assumed to be green, but the first color may be blue or red.

Components of the solid-state image sensor will be described in detail below.

(Photoelectric Conversion Element and Semiconductor Substrate)

In the semiconductor substrate 10, the plurality of photoelectric conversion elements 11 are two-dimensionally arranged corresponding to respective pixels. The photoelectric conversion elements 11 each have a function of converting light into an electrical signal.

For the purpose of protecting and flattening a surface (light incident surface) of the semiconductor substrate 10, a protective film is usually provided on an outermost surface of the semiconductor substrate 10 including the photoelectric conversion elements 11. The semiconductor substrate 10 is formed of a material that transmits visible light and can withstand a temperature of at least approximately 300° C. Examples of such a material include Si-containing materials, including Si, an oxide such as $SiO_2$, a nitride such as SiN, and a mixture of these compounds.

(Microlens)

The microlenses 18 are arranged above the semiconductor substrate 10 corresponding to respective pixel positions. Specifically, the microlenses 18 are provided for the respective photoelectric conversion elements 11 two-dimensionally arranged in the semiconductor substrate 10. The microlenses 18 focus light incident on the microlenses 18 onto the respective photoelectric conversion elements 11 to compensate for the lower sensitivity of the photoelectric conversion elements 11.

A height from a lens top to a lens bottom of the microlens 18 is preferably in the range of 400 nm or more and 800 nm or less.

(Lower Layer Flattening Layer)

The lower layer flattening layer 12 is a layer provided to protect and flatten the surface of the semiconductor substrate 10. Specifically, the lower layer flattening layer 12 reduces asperities on the upper surface of the semiconductor substrate 10 caused by production of the photoelectric conversion elements 11, and improves adhesion of a color filter material.

In the present embodiment, the lower layer flattening layer 12 other than a portion of the lower layer flattening layer 12 at the lower portion of the first-color color filter 14 is removed at a dry etching step (described later) or the like and is not present.

For example, the lower layer flattening layer 12 is formed of a resin containing one or more resins such as an acrylic resin, an epoxy resin, a polyimide resin, a phenol novolak resin, a polyester resin, a urethane resin, a melamine resin, a urea resin, and a styrene resin. The material of the lower layer flattening layer 12 is not limited to these resins, and may be any material that transmits visible light having a wavelength in the range of 400 nm to 700 nm and that does not inhibit pattern formation or adhesion of the color filters 14, 15, and 16.

The lower layer flattening layer 12 is preferably formed of a resin that does not influence spectral characteristics of the color filters 14, 15, and 16. For example, the lower layer flattening layer 12 is preferably formed to have a transmittance of 90% or more to visible light having a wavelength in the range of 400 nm to 700 nm. The lower layer flattening layer 12 provided on the lower side of the first-color color filter 14 may be omitted.

In the present embodiment, the lower layer flattening layer 12 is formed to have a thickness B [nm] of 0 [nm] or more and 200 [nm] or less. The thickness B is preferably 100 [nm] or less, and more preferably 60 [nm] or less. From the viewpoint of color mixture prevention, a lower layer flattening layer 12 having a smaller thickness B is more preferable.

(Upper Layer Flattening Layer)

The upper layer flattening layer 13 is a layer provided to flatten upper surfaces of the color filters 14, 15, and 16.

For example, the upper layer flattening layer 13 is formed of a resin containing one or more resins such as an acrylic resin, an epoxy resin, a polyimide resin, a phenol novolak resin, a polyester resin, a urethane resin, a melamine resin, a urea resin, and a styrene resin. The upper layer flattening layer 13 may be integrated with the microlenses 18.

For example, the upper layer flattening layer 13 has a thickness of 1 [nm] or more and 300 [nm] or less. The upper layer flattening layer 13 preferably has a thickness of 100 [nm] or less, and more preferably of 60 [nm] or less. From the viewpoint of color mixture prevention, an upper layer flattening layer 13 having a smaller thickness is more preferable.

(Color Filter)

The color filters 14, 15, and 16 constituting the color filter layer 30 in a predetermined pattern are filters that correspond to the respective colors and that perform color separation with respect to incident light. The color filters 14, 15, and 16 are provided between the semiconductor substrate 10 and the microlenses 18, and are arranged according to the respective pixel positions so as to correspond to respective photoelectric conversion elements 11 in a preset regular pattern.

Figure 2:
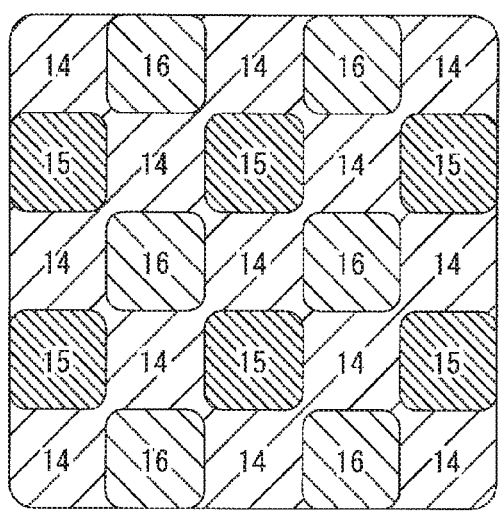
FIG. 2 is a partial plan view of a color filter array according to an embodiment of the present invention.

FIG. 2 illustrates a planar array of the color filters 14, 15, and 16 of the respective colors. The array example illustrated in FIG. 2 is what is termed a Bayer array.

The color filters 14, 15, and 16 each contain a pigment (coloring agent) of a predetermined color and a thermosetting component and/or a photocurable component. For example, as the coloring agent, the color filter 14 contains a green pigment, the color filter 15 contains a blue pigment, and the color filter 16 contains a red pigment.

In the present embodiment, the color filters 14, 15, and 16 contain the thermosetting resin and the photocurable resin, and the content of the thermosetting resin is preferably higher than that of the photocurable resin. In this case, for example, a curable component in a solid content is in the range of 5% by mass or more and 40% by mass or less, the thermosetting resin is in the range of 5% by mass or more and 20% by mass or less, and the photocurable resin is in the range of 1% by mass or more and 20% by mass or less. Preferably, the thermosetting resin is in the range of 5% by mass or more and 15% by mass or less, and the photocurable resin is in the range of 1% by mass or more and 10% by mass or less.

When the curable component is the thermosetting component only, the curable component in the solid content is in the range of 5% by mass or more and 40% by mass or less, and more preferably in the range of 5% by mass or more and 15% by mass or less. On the other hand, when the curable component is the photocurable component only, the curable component in the solid content is in the range of 10% by mass or more and 40% by mass or less, and more preferably in the range of 10% by mass or more and 20% by mass or less.

In the present embodiment, the solid-state image sensor including the color filters in the Bayer array illustrated in FIG. 2 will be described. However, the array of the color filters of the solid-state image sensor are not necessarily limited to be a Bayer array, and the colors of the color filters are not limited to the three RGB colors. Furthermore, a transparent layer having an adjusted refractive index may be arranged in part of the color filter array.

The first-color color filter 14 is formed to have a thickness A [nm] of 200 [nm] or more and 700 [nm] or less. The thickness A [nm] is preferably 400 [nm] or more and 600 [nm] or less. The thickness A [nm] is more preferably 500 [nm] or less.

The color filters 15 and 16 of the colors other than the first color are each formed to have a thickness satisfying the following formula (4), where C [nm] represents the thickness of the color filters 15 and 16.

$$C \leq A+B+200 \text{ [nm]} \quad (4)$$

The color filters 15 and 16 are each preferably formed to have a thickness satisfying the following formula (5).

$$A+B-200 \text{ [nm]} \leq C \leq A+B+200 \text{ [nm]} \quad (5)$$

However, the thickness of the second-color color filter 15 may differ from the thickness of the third-color color filter 16.

The reason that the difference between the thickness (A+B) and the thickness C is set to be 200 [nm] or less is that if the difference in the thickness exceeds 200 [nm] at a certain portion, light receiving sensitivity may be reduced due to the influence of light obliquely incident on another pixel. Furthermore, if a level difference exceeding 200 [nm] is present, it may be difficult to form the microlenses 18 above the color filters.

In order for the color filter layer 30 to have a small thickness, a concentration of the pigment (coloring agent) contained in the color filters of the first to third colors is preferably 50% by mass or more.

<Method of Manufacturing Solid-State Image Sensor>

Next, a method of manufacturing the solid-state image sensor of the first embodiment will be described with reference to FIGS. 3 and 4.

(Step of Forming Lower Layer Flattening Layer)

As illustrated in FIG. 3 (a), the semiconductor substrate 10 including the plurality of photoelectric conversion elements 11 is prepared, and the lower layer flattening layer 12 is formed on the entire surface of the semiconductor substrate 10 on which the filter layer is to be formed. For example, the lower layer flattening layer 12 is formed of a resin containing one or more of the resin materials such as an acrylic resin mentioned above or a compound such as an oxide compound or a nitride compound.

The lower layer flattening layer 12 is formed by a method in which a coating liquid containing the above-mentioned resin material is applied and heated to be cured. The lower layer flattening layer 12 may be formed by forming a film of the above-mentioned compound by various methods such as vapor deposition, spattering, and CVD.

The method of manufacturing the solid-state image sensor according to the present embodiment differs from a conventional method of manufacturing a solid-state image sensor by directly patterning the color filters 14, 15, and 16 constituting the color filter layer 30 by photolithography using a photosensitive color filter material.

Specifically, in the method of manufacturing the solid-state image sensor according to the present embodiment, a first-color color filter material is applied to an entire surface and cured to form a first-color color filter layer 14A (see FIG. 3 (d)), followed by removal by dry etching of portions of the first-color color filter layer 14A where other color filters are to be formed. Thus, a pattern of the first-color color filter 14 (see FIG. 4 (b)) is formed. Then, second and subsequent color filters (second-color color filter pattern 15, third-color color filter pattern 16) are formed by patterning at portions surrounded by the pattern of the first-color color filter 14. At this time, the pattern of the first-color color filter 14 formed earlier is used as a guide pattern to cure second and subsequent color filter materials by heat treatment at a high temperature. Accordingly, even though the lower layer flattening layer 12 is not present on a lower side of the second and subsequent color filters, adhesion between the semiconductor substrate 10 and the color filters 15 and 16 can be improved.

A step of forming the color filters will be described below.

(Step of Forming First-Color Color Filter Layer (First Step))

First, as illustrated in FIGS. 3 (b) to (d), a step of forming the first-color color filter 14 on a surface of the lower layer flattening layer 12 formed on the semiconductor substrate 10 will be described. As the guide pattern, the first-color color filter 14 is preferably a color filter that occupies a largest area in the solid-state image sensor.

As illustrated in FIG. 3 (b), a first-color color filter material 14a made of a first resin dispersion whose main component is a resin material and in which a first pigment (coloring agent) is dispersed is applied onto the surface of the lower layer flattening layer 12 formed on the semiconductor substrate 10 in which the plurality of photoelectric conversion elements 11 are two-dimensionally arranged. In the solid-state image sensor according to the present embodiment, as illustrated in FIG. 2, the color filters in a Bayer array are assumed to be used. Thus, the first color is preferably green (G).

The resin material of the first-color color filter material is a mixed resin containing a thermosetting resin such as an epoxy resin and a photocurable resin such as an ultraviolet curable resin. In the mixed resin, the content of the photocurable resin is lower than that of the thermosetting resin. Unlike when the photocurable resin in larger amount than the thermosetting resin is used as a curable resin, when a larger amount of the thermosetting resin than the photocurable resin is used as the resin material, a high content percentage of pigment in the first-color color filter layer 14A can be achieved. This facilitates formation of the first-color color filter 14 that has a small thickness and has desired spectral characteristics.

The present embodiment describes a case where the resin material of the first-color color filter material is a mixed resin containing both the thermosetting resin and the photocurable resin. However, the resin material of the first-color color filter material is not necessarily limited to a mixed resin, and may be a resin containing only either one of the curable resins.

Next, as illustrated in FIG. 3 (c), an entire surface of the first-color color filter layer 14A is irradiated with ultraviolet light to photocure the color filter layer 14A. Unlike when a photosensitive color filter material is exposed to directly form a desired pattern as in the conventional method, in the present embodiment, the entire surface of the color filter layer 14A is cured. Thus, the color filter layer 14A can be cured even when the content of the photosensitive component is reduced.

Next, as illustrated in FIG. 3 (d), the first-color color filter layer 14A is thermally cured at a temperature of 200° C. or more and 300° C. or less. More specifically, the first-color color filter layer 14A is preferably heated at a temperature of 230° C. or more and 270° C. or less. In the manufacture of a solid-state image sensor, a high temperature heating step at a temperature of 200° C. or more and 300° C. or less is very often used during formation of the microlens 18. Accordingly, the first-color color filter material desirably has high temperature resistance. Thus, it is more preferable to use a thermosetting resin having high temperature resistance as the resin material.

(Step of Forming Etching Mask Pattern)

Next, as illustrated in FIGS. 3 (e) to 3 (g), an etching mask pattern having an opening is formed on the first-color color filter layer 14A formed at the previous step.

First, as illustrated in FIG. 3 (e), a photosensitive resin mask material is applied to the surface of the first-color color filter layer 14A and dried to form a photosensitive resin film 20.

Next, as illustrated in FIG. 3 (f), the photosensitive resin film 20 is exposed by using a photomask (not illustrated) to cause a chemical reaction so that a portion other than a necessary pattern becomes soluble in a developing solution.

Next, as illustrated in FIG. 3 (g), the unnecessary portion (exposed portion) of the photosensitive resin film 20 is removed by development. Thus, an etching mask pattern 20a having an opening 20b is formed. At a position of the opening 20b, the second-color color filter or the third-color color filter is formed at a later step.

As the photosensitive resin material, for example, an acrylic resin, an epoxy resin, a polyimide resin, a phenol novolak resin, or other photosensitive resins may be used alone, or a mixture or copolymer of two or more of these resins may be used. Examples of an exposure machine used in a photolithography process of patterning the photosensitive resin film 20 include a scanner, a stepper, an aligner, and a mirror projection aligner. The exposure may be performed by direct drawing with an electron beam, drawing with a laser, or the like. In particular, a stepper or a scanner is generally used to form the first-color color filter 14 of a solid-state image sensor of a small size.

In order to produce a pattern with high resolution and high precision, the photosensitive resin mask material is desirably a general photoresist. Unlike when the pattern is formed of a photosensitive color filter material, the use of the photoresist makes it possible to form a pattern for which shape control is easy and which has high dimensional accuracy.

The photoresist used at this time desirably has high dry etching resistance. When the photoresist is used as an etching mask material during dry etching, in order to increase a selection ratio which is an etching rate of the etching mask material to an etching material, development is very often followed by a thermal curing step called post bake. When the thermal curing step is used, however, after dry etching, the photoresist may be difficult to be removed at a step of removing a residual resist used as the etching mask. Accordingly, the photoresist preferably has a good selection ratio to the etching material even when the thermal curing step is not used. When the photoresist does not have a good selection ratio, the photoresist material is desired to have a large thickness, but the photoresist material having a large thickness makes it difficult to form a fine pattern. Thus, the photoresist is preferably a material having high dry etching resistance.

Specifically, an etching rate ratio (selection ratio) of the photosensitive resin mask material which is the etching mask and the first-color color filter material which is to be dry etched is preferably 0.5 or more, and more preferably 0.8 or more. With the above selection ratio, the color filter 14 can be etched while not all the etching mask pattern 20a is eliminated. When the first-color color filter material has a thickness of approximately 0.3 μm or more and 0.8 μm or less, the photosensitive resin mask layer 20a desirably has a thickness of approximately 0.6 μm or more and 2.0 μm or less.

Furthermore, the photoresist used at this time may be a positive resist or a negative resist. However, considering removal of the photoresist after etching, a positive resist is more desirable than a negative resist. This is because, due to an external factor, in the positive resist, a chemical reaction is more likely to occur so that the resist is dissolved as the chemical reaction progresses, and in the negative resist, the resist is changed to be cured as the chemical reaction progresses.

Thus, the etching mask pattern is formed.

(Step of Forming First-Color Color Filter)

Figure 4:
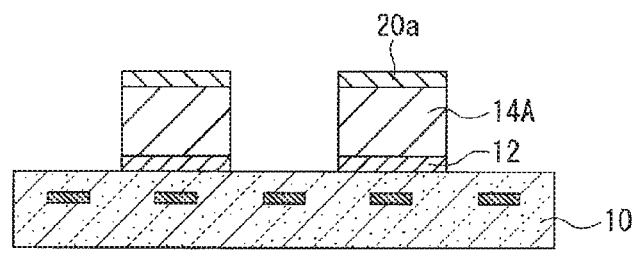
FIGS. 4(a) and 4(b) are cross-sectional views illustrating, in order of steps, a process of producing the first-color color filter pattern by a dry etching method according to an embodiment of the present invention.
Figure 4:
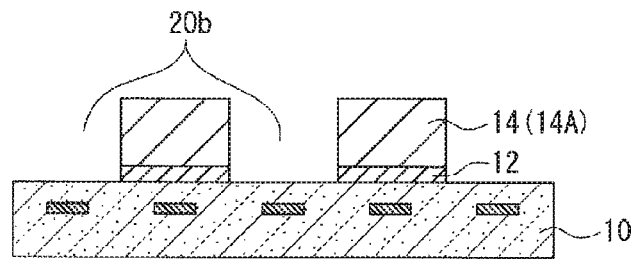

As illustrated in FIG. 4 (a), a part of the first-color color filter layer 14A exposed from the opening 20b is removed by dry etching using the etching mask pattern and a dry etching gas.

Examples of a dry etching method include use of ECR, parallel plate magnetron, DRM ICP, and dual-frequency RIE (Reactive Ion Etching). An etching type is not particularly limited, but is desirably an etching type in which an etching rate and an etching shape can be controlled to be unchanged even when a line width or an area varies, such as cases of a large-area pattern having a width of several millimeters or more and a minute pattern having a width of a several hundred nanometers. Furthermore, it is desirable to use a dry etching method having a control mechanism in which an entire surface of a wafer having a size in the range of approximately 100 mm to 450 mm is dry etched uniformly in a plane.

The dry etching gas is a gas having reactivity (oxidizing property, reducing property), i.e., a gas having an etching property. Examples of the gas having reactivity include gases containing fluorine, oxygen, bromine, sulfur, chlorine, and the like. Furthermore, a noble gas containing an element such as argon or helium that has low reactivity and causes etching to be performed by the physical impact of ions can be used alone, or a mixture of such noble gases can be used. The gas having reactivity is not limited to the above gases, as long as the gas causes a reaction in which a desired pattern is formed at a dry etching step under a plasma environment using the gas. In the present embodiment, at an early stage, etching is performed by setting a gas flow rate so that 90% or more of a total gas flow rate is a gas that causes etching to be principally performed by the physical impact of ions, such as a noble gas, and by using an etching gas in which a fluorine gas and an oxygen gas are mixed. Thus, by also using a chemical reaction, an etching rate is increased.

In the present embodiment, the semiconductor substrate 10 is composed of a material principally made of silicon. Accordingly, the dry etching gas is desirably a gas by which the color filter material is etched and the semiconductor substrate 10 which is a base is not etched. When a gas by which the semiconductor substrate 10 is etched is used, multistage etching may be performed in which etching is performed, first, by using the gas by which the semiconductor substrate 10 is etched, and at a certain time point, the etching gas is switched to a gas by which the semiconductor substrate 10 is not etched. The type of the etching gas is not limited, as long as the etching gas does not influence the semiconductor substrate 10, enables the color filter material to be etched to have a shape close to a vertical shape by using the etching mask pattern 20a, and leaves no residue of the color filter material.

In the present embodiment, etching is performed by setting the gas flow rate so that 90% or more of the total gas flow rate is a noble gas containing an element having low reactivity such as argon or helium, and by using a dry etching gas in which one or more kinds of gases having reactivity, such as a fluorine gas and an oxygen gas, are mixed. This can improve the etching rate by using a chemical reaction.

When etching is performed under the above etching condition, a large amount of reaction product is adhered to a side wall of the etching mask pattern, and this makes removal of the etching mask 20 difficult. Accordingly, it is desirable to facilitate the removal of the etching mask 20 by changing the dry etching condition in stages according to the situation.

Specifically, at an early stage of the etching, etching is performed by setting the gas flow rate so that 90% or more of the total gas flow rate is a noble gas having low reactivity, and by using an etching gas containing a gas having reactivity. At this time, an initial thickness of the first-color color filter layer 14A is preferably etched by 30% or more and 90% or less, more preferably 50% or more and 80% or less, and still more preferably 60% or more and 70% or less.

At a next stage, etching is performed by setting the gas flow rate so that 80% or less of the total gas flow rate is a noble gas having low reactivity, and by using a gas having reactivity such as a fluorine gas or an oxygen gas or a dry etching gas in which two or more of these gases are mixed. At this time, the flow rate of the noble gas is preferably 70% or less of the total gas flow rate, and more preferably 50% or less of the total gas flow rate.

Next, at the above flow gas rate, the first-color color filter layer 14A is etched to such an extent that the semiconductor substrate 10 is not etched. Then, the fluorine gas is removed, and overetching is performed by using a gas by which Si is not chemically etched, for example, by using an oxygen gas or a noble gas alone or using a gas in which two or more of these gases are mixed. In the overetching, etching is performed with a thickness exceeding the thickness of the first-color color filter layer 14A. The overetching makes it possible to reduce the influence of variations in a plane caused by the etching of the semiconductor substrate 10 and to remove the first-color color filter layer 14A at a desired position on the entire surface of the semiconductor substrate 10 to form the pattern of the first-color color filter 14.

Under the condition mentioned above, as illustrated in FIG. 4 (b), the first-color color filter layer 14A is dry etched until the surface of the semiconductor substrate 10 is reached, and then the etching mask pattern 20a is removed. Thus, the pattern of the first-color color filter 14 is formed. In the present embodiment, when the part of the first-color color filter layer 14A exposed from the opening 20b is removed, a portion of the lower layer flattening layer 12 located at the opening 20b is etched. Accordingly, the lower layer flattening layer 12 remains only below a position of the pattern of the first-color color filter 14.

Depending on the material of the lower layer flattening layer 12, in some cases, when the dry etching step mentioned above is performed, the etching rate is slow and thus the lower layer flattening layer 12 is not completely removed at portions where the second and subsequent color filters are to be formed. In such a case, a distance from a top of the microlens to the device is increased, and this reduces the effect of the second and subsequent color filters having a small thickness. Thus, a further step of removing the lower layer flattening layer 12 is performed. Specifically, the lower layer flattening layer 12 is removed by long-time etching in which a thickness of the etching mask pattern 20 is increased by physical etching using argon or the like or by a wet etching step using a solvent for etching the lower layer flattening layer 12. In this case, it is desirable to use an etching solution having no or minor influence on the color filter material. This is because an upper portion of the first-color color filter is covered with the etching mask pattern 20, but a side surface of the first-color color filter is exposed, except for a portion of the reaction product from the dry etching.

Next, the remaining etching mask pattern 20a is removed (see FIG. 4 (b)). For example, the etching mask pattern 20a may be removed by a removal method of dissolving and peeling off the etching mask pattern 20a by using a chemical solution or a solvent without influencing the first-color color filter 14. As the solvent for removing the etching mask pattern 20a, for example, an organic solvent such as N-methyl-2-pyrrolidone, cyclohexanone, diethylene glycol monomethyl ether acetate, methyl lactate, butyl lactate, dimethyl sulfoxide, diethylene glycol diethyl ether, propylene glycol monoethyl ether, propylene glycol monomethyl ether, or propylene glycol monoethyl ether acetate is used alone, or a mixed solvent of two or more of these organic solvents is used. The solvent used at this time is desirably a solvent that does not influence the color filter material. As long as the color filter material is not influenced, a removal method using an acidic chemical agent may be employed.

A removal method other than the wet process using a solvent or the like may also be employed. The etching mask pattern 20a can be removed by a method using an ashing technique which is a resist ashing technique using photoexcitation or oxygen plasma. These methods may be used in combination. For example, the etching mask pattern 20a may be removed by a method in which, first, a layer altered by dry etching of an outer layer of the etching mask pattern 20a is removed by the ashing technique which is the ashing technique using photoexcitation or oxygen plasma, followed by removal of the remaining layer by wet etching using a solvent or the like. The etching mask 20 may be removed only by ashing to such an extent that the first-color color filter material is not damaged. Furthermore, not only the dry process such as ashing but also a polishing step by CMP or the like may be used.

Through the above steps, the patterning formation of the first-color color filter 14 is completed.

As illustrated in FIGS. 3 (b) and (c), when the color filter material is applied to the entire surface of the semiconductor substrate 10, the entire surface of the first-color color filter 14 is photocured and thermally cured. In order to perform a development step and a cleaning step, a further curing step may be used. An example of such a further curing step may be a high temperature heating step at a temperature of 200° C. or more and 300° C. or less or photocuring by exposure.

(Step of Forming Patterns of Second and Subsequent Color Filters (Second Step))

Next, as illustrated in FIGS. 5(a)-5(h), the second-color color filter 15 and the third-color color filter 16 containing the pigments of the colors different from that of the first-color color filter 14 are formed. Methods of producing patterns of the second-color color filter 15 and the third-color color filter 16 can be broadly divided into two methods.

A first method is a pattern forming method in which the pattern of the first-color color filter 14 is used as a guide pattern to form the second-color color filter 15 and the third-color color filter 16 by using a photosensitive color filter material containing a photocurable resin and selectively exposing the photosensitive color filter material by the conventional method.

In a second method, a second-color color filter material is applied to an entire surface of the opening 20b formed in the patterned first-color color filter 14. Subsequently, dry etching is performed by using a patterned photosensitive resin mask material layer as an etching mask to form an opening at a portion where the third-color color filter 16 is to be formed. Finally, a third-color color filter material is applied to the portion where the opening is located, and an excess color filter is removed by polishing or the like to form the third-color color filter 16 in the opening.

(First Method of Forming Patterns of Second and Subsequent Color Filters)

First, the first method of forming patterns of the second and subsequent color filters will be described with reference to FIGS. 5(a)-5(h). The first method is characterized in that a color filter material (color resist) containing a photosensitive component is used for the second-color color filter 15.

Figure 5:
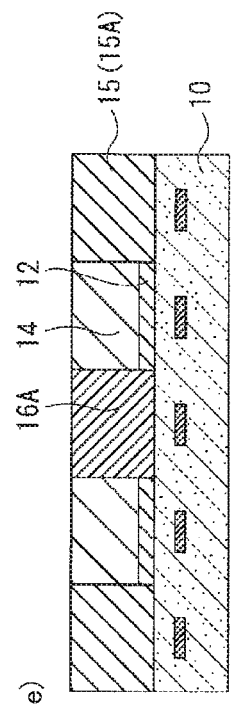
FIGS. 5(a)-5(h) are cross-sectional views illustrating, in order of steps, a process of producing second-color and third-color color filter patterns by photolithography according to the first embodiment of the present invention.
Figure 5:
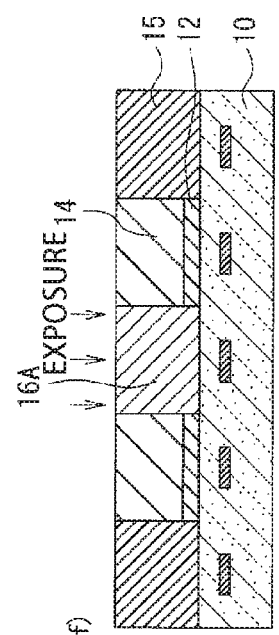
Figure 5:
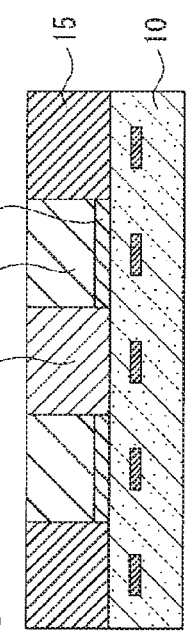
Figure 5:
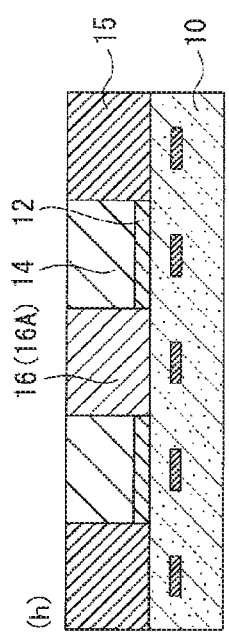
Figure 5:
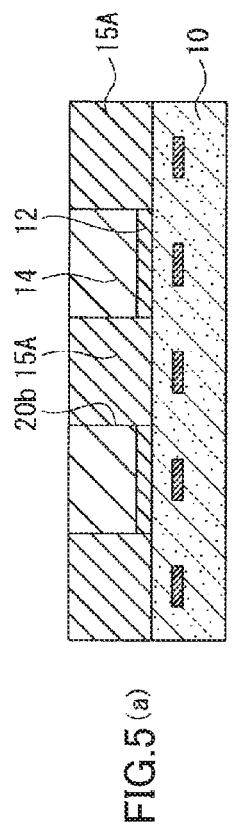
Figure 5:
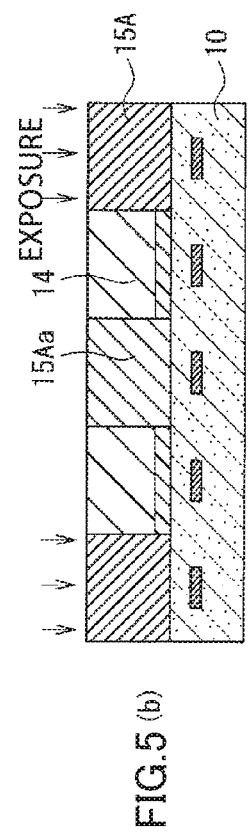
Figure 5:
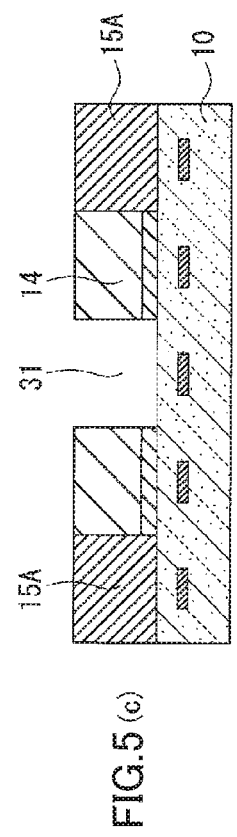
Figure 5:
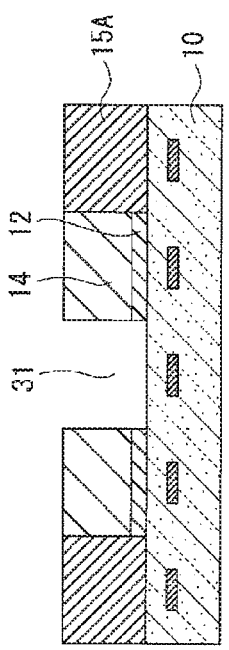

First, as illustrated in FIG. 5 (a), a photosensitive color filter material is applied as the second-color color filter material to the entire surface of the semiconductor substrate 10 on which the first-color color filter 14 has been formed by patterning, i.e., to the entire surface of the opening 20b, and is dried to form a second-color color filter layer 15A. The photosensitive color filter material used at this time contains a negative photosensitive component that is cured by being irradiated with light.

At this time, a thickness C1 [nm] of the second-color color filter 15 is set so that the following formulas (1), (3), and (4a) are satisfied, where A [nm] represents the thickness of the first-color color filter 14, B [nm] represents the thickness of the lower layer flattening layer 12, and C1 [nm] represents the thickness of the second-color color filter 15.

$$200 \text{ [nm]} \leq A \leq 700 \text{ [nm]} \tag{1}$$

$$0 \text{ [nm]} \leq B \leq 200 \text{ [nm]} \tag{3}$$

$$C1 \leq A+B+200 \tag{4a}$$

FIGS. 5(a)-5(h) illustrate, as an example, a case where A+B=C1, but the thickness C1 may vary as long as it satisfies formula (4a).

Furthermore, the thickness C1 preferably satisfies "A+B−200 [nm]≤C1≤A+B+200". That is, the thickness C1 is preferably in the range of (A+B)±200 [nm].

When the second-color color filter 15 has the thickness C1 in the above range, in the second-color color filter 15 containing a thermosetting resin and a photocurable resin sufficient for curing, the pigment can be dispersed at a pigment concentration at which the second-color color filter 15 has desired spectral characteristics.

Next, as illustrated in FIG. 5 (b), a portion where the second-color color filter 15 is to be formed is exposed by using a photomask to photocure the second-color color filter layer 15A.

Next, as illustrated in FIG. 5 (c), a part 15Aa (a position at which the third-color color filter is to be formed) of the second-color color filter layer 15 that has been selectively unexposed is removed at a development step to form an opening 31. Next, as illustrated in FIG. 5 (d), in order to improve adhesion between the exposed part of the second-color color filter layer 15A and the semiconductor substrate 10 and to improve heat resistance in actual use of the device, the remaining second-color color filter 15 is cured by performing a curing process by high temperature heating. Thus, the pattern of the second-color color filter 15 is formed. At this time, the temperature used for the curing is preferably 200° C. or more.

Next, as illustrated in FIG. 5 (e), the third-color color filter material is applied to the entire surface of the semiconductor substrate 10, i.e., entire surface of the opening formed in the second-color color filter 15, to form a third-color color filter layer 16A.

Next, as illustrated in FIG. 5 (f), a portion of the third-color color filter layer 16A where the third-color color filter 16 is to be formed is selectively exposed to photocure the portion of the third-color color filter layer 16A located at the opening 31.

Next, as illustrated in FIG. 5 (g), the photosensitive third-color color filter layer 16A is developed, and a part of the third-color color filter layer 16A that has not been exposed is removed. Next, as illustrated in FIG. 5 (h), in order to improve adhesion between the exposed part of the third-color color filter layer 16A and the semiconductor substrate 10 and to improve heat resistance in actual use of the device, the remaining third-color color filter layer 16A is cured by performing a curing process by high temperature heating. Thus, the third-color color filter 16 is formed.

Color filters of a desired number of colors can be formed by repeating the step of forming patterns of the second-color color filter 15 and the subsequent color filters.

At this time, a thickness C2 [nm] of the third-color color filter 16 is set so that the following formulas (1), (3), and (4b) are satisfied, where C2 [nm] represents the thickness of the third-color color filter 16.

$$200 \text{ [nm]} \leq A \leq 700 \text{ [nm]} \quad (1)$$

$$0 \text{ [nm]} \leq B \leq 200 \text{ [nm]} \quad (3)$$

$$C2 \leq A+B+200 \quad (4b)$$

FIGS. 5(a)-5(h) illustrate, as an example, a case where A+B=C2, but the thickness C2 may vary as long as it satisfies formula (4b).

Furthermore, the thickness C2 preferably satisfies "A+B−200 [nm]≤C2≤A+B+200". That is, the thickness C2 is preferably in the range of (A+B)±200 [nm].

When the third-color color filter 16 has the thickness C2 in the above range, in the third-color color filter 16 containing a thermosetting resin and a photocurable resin sufficient for curing, the pigment can be dispersed at a pigment concentration at which the third-color color filter 16 has desired spectral characteristics.

Through the above steps, the color filters are formed so that a height of the second-color color filter 15 and the third-color color filter 16 has a value equivalent to a value obtained by adding the thickness of the first-color color filter 14 to the thickness of the lower layer flattening layer 12.

Figure 6:
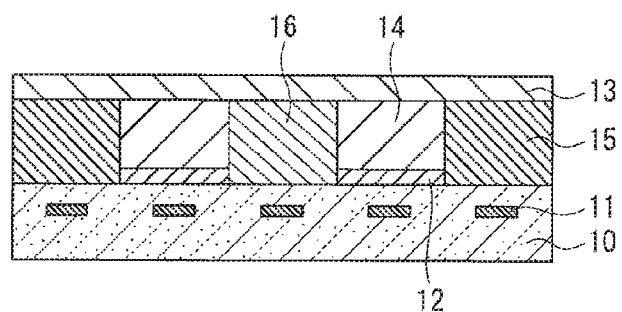
FIGS. 6(a) and 6(b) are cross-sectional views illustrating, in order of steps, a process of producing a microlens by photolithography according to the first embodiment of the present invention.
Figure 6:
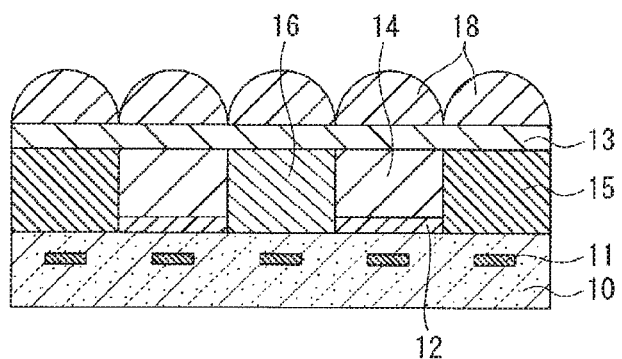

Next, as illustrated in FIG. 6 (a), the upper layer flattening layer 13 is formed on the formed color filters 14, 15, and 16. For example, the upper layer flattening layer 13 can be formed by using a resin containing one or more of the resin materials such as an acrylic resin mentioned above. In this case, the upper layer flattening layer 13 can be formed by applying the resin material to the surface of the semiconductor substrate 10, followed by curing the resin material by heating. Alternatively, for example, the upper layer flattening layer 13 can be formed by using a compound such as the oxide or the nitride mentioned above. In this case, the upper layer flattening layer 13 can be formed by various film forming methods such as vapor deposition, spattering, and CVD.

Finally, as illustrated in FIG. 6 (b), the microlens 18 is formed on the upper layer flattening layer 13. The microlens 18 is formed by a publicly known technique such as a production method by thermal flow, a microlens production method using a gray tone mask, or a microlens transfer method to the upper layer flattening layer 13 using dry etching.

For example, the upper layer flattening layer 13 has a thickness of 1 [nm] or more and 300 [nm] or less. The upper layer flattening layer 13 preferably has a thickness of 100 [nm] or less, and more preferably of 60 [nm] or less.

Figure 7:
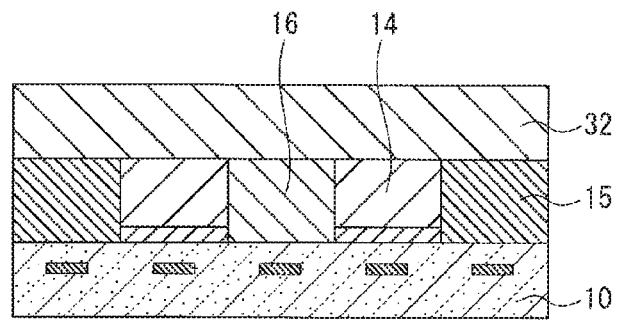
FIGS. 7(a)-7(c) are cross-sectional views illustrating, in order of steps, a process of producing a microlens by a transfer method using etchback according to the first embodiment of the present invention.
Figure 7:
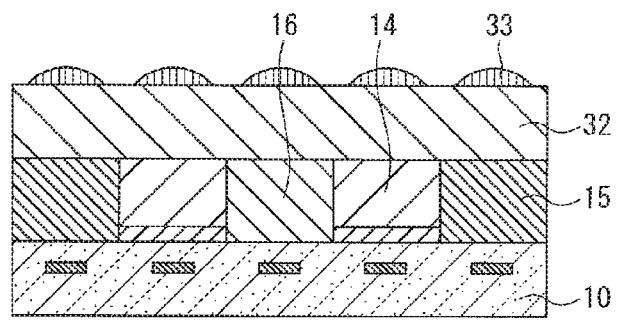
Figure 7:
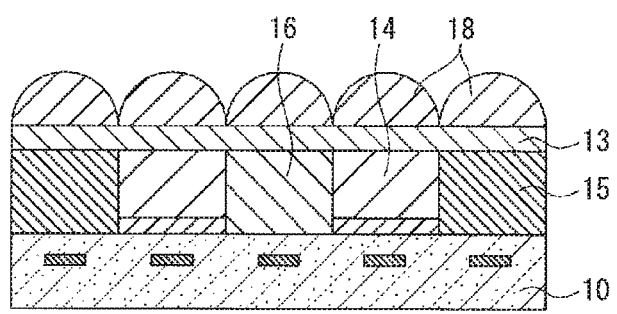

In a method of forming a microlens by using a patterning technique by dry etching with good shape controllability, as illustrated in FIG. 7 (a), first, a transparent resin layer 32 (which may also serve as the upper layer flattening layer 13) which is to be a microlens at the end is formed on the color filters.

Next, as illustrated in FIG. 7 (b), a matrix 33 (lens matrix) of the microlens is formed on the transparent resin layer 32 by a thermal flow method. Next, as illustrated in FIG. 7 (c), a shape of the lens matrix is transferred to the transparent resin layer 32 by a dry etching method using the lens matrix 33 as a mask. A proper lens shape can be transferred to the transparent resin layer 32 by selecting a height and a material of the lens matrix 33 and adjusting a condition for the etching.

By the above method, a microlens can be formed with good controllability. It is desirable to use the above method to produce a microlens so that a height from a lens top to a lens bottom of the microlens is in the range of 400 to 800 nm.

Through the steps described above, the solid-state image sensor of the present embodiment is completed.

In the present embodiment, the first-color color filter 14 is preferably the color filter that occupies a largest area. Then, the second-color color filter 15 and the third-color color filter 16 are each formed by photolithography using a photosensitive color resist.

The technique using a photosensitive color resist is a conventional technique of manufacturing a color filter pattern. Since the first-color color filter material is applied to the entire surface of the lower layer flattening layer 12 and then heated at a high temperature, the semiconductor substrate 10 can be very strongly adhered to the lower layer flattening layer 12. Accordingly, by using the pattern of the first-color color filter 14 with good adhesion and good rectangularity as the guide pattern, the second-color color filter 15 and the third-color color filter 16 can be formed so as to fill an area whose four sides are surrounded. Thus, even when a photosensitive color resist is used for the second and subsequent color filters, unlike the conventional technique, the photosensitive color resist does not need to be a color resist in which emphasis is placed on resolution performance. Accordingly, the amount of the photocurable component in the photocurable resin can be made small, and thus a ratio of the pigment in the color filter material can be made large. This enables the color filters 15 and 16 to have a small thickness.

At the portions where the second and subsequent color filters are to be formed, the lower layer flattening layer 12 has been removed at the etching step during the etching of the first-color color filter 14, so that the semiconductor substrate 10 is exposed at the surface. In this case, the surface of the semiconductor substrate 10 may have been oxidized and have become hydrophilic. If the second and subsequent color filters are formed on the surface of the semiconductor substrate 10 by a photolithography process, a developing solution reaches a portion at which the hydrophilic semiconductor substrate 10 is in contact with the second and subsequent color filters. Accordingly, the second and subsequent color filters (the second-color color filter 15 and the third-color color filter 16) are assumed to be peeled off. Thus, the possibility of peeling-off of the second and subsequent color filters can be reduced by, depending on a state of the surface of the semiconductor substrate 10, causing the exposed surface of the semiconductor substrate 10 to be hydrophobic by an existing method, for example, by a method such as HMDS (hexamethyldisilazane) treatment.

In the present embodiment, the first-color color filter 14 is desirably formed of a color filter material in which a content percentage of a resin component and the like involved in photocuring is low and a content percentage of a pigment is high. In particular, the content percentage of the pigment in the first-color color filter material is desirably 70% by mass or more. Thus, even when the first-color color filter material contains pigment at a concentration at which curing is insufficient in a conventional photolithography process using a photosensitive color resist, the first-color color filter 14 can be formed with good precision and with no residue or peeling-off. Specifically, when a green filter is used as the first-color color filter 14, a photocurable component of a red filter or a blue filter can be reduced. Accordingly, even when the content percentage of the pigment is high, the color filter patterns can be easily formed by photolithography.

For whatever reason, the first-color color filter 14 formed first is formed by using the first-color color filter material in which emphasis is placed not on pattern formation but on photocuring using a small amount of photosensitive component, and in which curing of the thermosetting component is the principal focus. Thus, the first-color color filter 14 is adhered to the semiconductor substrate 10 and the lower layer flattening layer 12, and no residue or peeling-off occurs in the first-color color filter 14 during formation of other color filters. Furthermore, the first-color color filter 14 can have high resolution. Then, the second-color color filter 15 and the third-color color filter 16 are formed by using the photosensitive second-color and third-color color filter materials by an efficient photolithography method involving a small number of steps. Thus, the pattern of the first-color color filter 14 formed first serves as an accurate pattern guide, and the patterns of the second-color color filter 15 and the third-color color filter 16 having a good shape can be formed by photolithography.

(Second Method of Forming Patterns of Second and Subsequent Color Filters)

Next, the second method of forming the second and subsequent color filter patterns will be described with reference to FIGS. 8 and 9. In the second method, the second-color color filter 15 and the third-color color filter 16 are formed of a non-photosensitive color filter material.

The second method will be described below.

To the entire surface of the substrate 10 illustrated in FIG. 8 (a) on which the first-color color filter 14 has been formed by the forming method mentioned above, the second-color color filter material is applied as illustrated in FIG. 8 (b). The second-color color filter material used at this time is a non-photosensitive thermosetting resin material that is cured by being heated. Since the second-color color filter material is not photosensitive, as mentioned above, a photosensitive component does not need to be added, and thus the second-color color filter material can have a high pigment concentration. This enables the second-color color filter 15 to have a small thickness. Then, in order to form the second-color color filter layer 15A by curing the second-color color filter material, the second-color color filter material is heated at high temperature. The heating is preferably performed at a heating temperature at which the device is not influenced. Specifically, the heating temperature is preferably 300° C. or less, and more preferably 240° C. or less.

At this time, as illustrated in FIG. 8 (b), in order to cause the second-color color filter layer 15A to have a uniform thickness, a rather large amount of second-color color filter material is applied. Accordingly, an excess amount of second-color color filter material is provided on the first-color color filter 14. In order to remove an excess portion of the second-color color filter, a polishing step such as CMP or an etchback step using a dry etching technique is performed. The second-color color filter material can be removed by performing a step using a publicly known technique such as flattening or removal of a material with a desired thickness. As long as no problem occurs at an etching step (described later) of opening a portion where the third-color color filter 16 is to be formed, the step of removing the excess portion of the second-color color filter layer 15A may be performed at the end after the color filters 14, 15, and 16 of the plurality of colors are formed.

Next, as illustrated in FIG. 8 (c), a photosensitive resin mask material is applied to an upper portion of the second-color color filter layer 15A to form a photosensitive resin mask layer 35.

Subsequently, as illustrated in FIGS. 8 (d) and (e), the photosensitive resin mask layer 35 is exposed and developed so that a portion of the photosensitive resin mask layer 35 where the third-color color filter 16 is to be arranged is opened. Thus, the etching mask 20 having an opening 20c is formed.

Subsequently, as illustrated in FIG. 8 (0, a dry etching technique using the etching mask 20 having the opening is used to remove a portion in a region of the second-color color filter layer 15A at which the third-color color filter 16 is to be arranged and is thus unnecessary. Thus, an opening 20d is formed. At this time, a curing process such as heating or ultraviolet light irradiation may be performed with respect to the etching mask 20.

Next, as illustrated in FIG. 8 (g), the etching mask 20 is removed by a publicly known removal method such as peeling-off using a solvent and cleaning or ashing which is an ashing process using photoexcitation or oxygen plasma. Thus, the opening is provided at the position at which the third-color color filter 16 is to be formed, and the first-color color filter 14 and the second-color color filter 15 are provided at positions other than the position of the opening.

Figure 9:
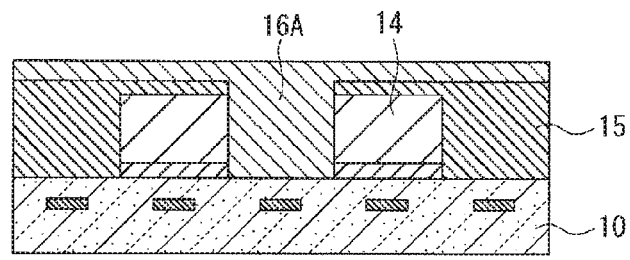
FIGS. 9(a) and 9(b) are cross-sectional views illustrating, in order of steps, a process of producing a third-color color filter pattern by dry etching according to the first embodiment of the present invention.
Figure 9:
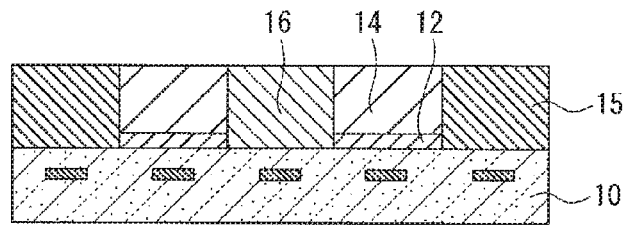

Next, as illustrated in FIG. 9 (a), to the entire surface of the substrate 10 on which the first-color color filter 14 and the second-color color filter 15 are provided, the third-color color filter material is applied so as to fill the opening 20d, and heat cured to form the third-color color filter layer 16A. Then, as illustrated in FIG. 9 (b), with respect to an excess portion of the third-color color filter layer 16 on the first-color color filter 14 and the second-color color filter 15, a polishing step such as CMP or an etchback step using a dry etching technique is performed to a predetermined thickness. Thus, the excess portion of the third-color color filter layer 16 is removed by performing a step using a publicly known technique such as flattening or removal of a material with a desired thickness to form the third-color color filter 16. At this time, when the excess portion of the second-color color filter 15 remains on the first-color color filter, the excess portion of the second-color color filter 15 may be removed together.

In a case where the number of colors of the color filters is four or more, and fourth and subsequent color filters are to be formed, similarly to the second-color color filter 15 and the third-color color filter 16, a process may be performed in which a color filter material is applied and cured. Then, the excess photosensitive resin mask layer 20a is removed by performing dry etching using, as an etching mask, a photosensitive resin material having an opening formed by patterning. Thus, the color filters of the plurality of colors can be formed.

By forming, through the above-mentioned process, the upper layer flattening layer 13 and the microlens on the formed color filter materials of the plurality of colors, the solid-state image sensor of the present embodiment is completed.

The first method mentioned above is a method of forming the second-color color filter 15 and the subsequent color filters by photolithography. In the first method, the color filter materials of the second-color color filter 15 and the subsequent color filters are photocurable, and the color filter materials are selectively exposed and developed to form the second-color color filter 15 and the subsequent color filters.

On the other hand, the second method mentioned above is a forming method in which dry etching is repeated multiple times. In the second method, the color filter materials of the second-color color filter 15 and the subsequent color filters contain a thermosetting component but no photosensitive component, and the color filter materials are applied to the entire surface and thermally cured. Then, the photosensitive mask material is formed as the etching mask on the first-color color filter 14 and the second-color color filter 15 desired to be left, and the second-color color filter 15 and the subsequent color filters are also produced by dry etching. In these two methods, the same step is repeated to form the second-color and third-color color filters. However, these steps may be combined together if desired spectral characteristics are obtained.

In the present embodiment, both the thermosetting resin and the photocurable resin are used for the first-color color filter 14. Furthermore, at the curing step for the first-color color filter 14, the first-color color filter 14 is photocured by exposure and heat cured by heat. In order for the color filter layer 30 to have a small thickness, the pigment concentration is high. When the content percentage of the pigment is high, however, the color filter layer 30 is more likely to have low solvent resistance. Accordingly, when the color filter layer 30 comes into contact with a solvent at the development step, the etching mask removing step, the application or development step for the second and subsequent color filters, or the like, the component of the first-color color filter 14 may be dissolved, and this may influence the spectral characteristics. An effect of improving solvent resistance is yielded by mixing the photosensitive photocurable component resin in the color filter material and exposing the color filter material, so that the surface of the color filter is cured, and by mixing the thermosetting resin in the color filter material and heat curing the color filter material at a high temperature, so that the inside and the surface of the color filter are cured.

As has been described, according to the present embodiment, all the color filters can have a small thickness, and thus a total distance from the top of the microlens to the device can be made short. This makes it possible to provide a high-definition solid-state image sensor in which less color mixture occurs and all color filters arranged in pattern have high sensitivity.

Second Embodiment

A solid-state image sensor and a method of manufacturing the solid-state image sensor according to a second embodiment of the present invention will be described below with reference to FIGS. 10(*a*)-10(*d*). The solid-state image sensor according to the second embodiment of the present invention has a structure similar to that of the first embodiment. The second embodiment differs from the first embodiment in a step during curing of the first-color color filter. Thus, a step of curing the first-color color filter will be described.

<Configuration of Solid-State Image Sensor>

The solid-state image sensor according to the present embodiment is characterized in that the first-color color filter material contains no photosensitive resin material and is composed of only a thermosetting resin. Since the first-color color filter material contains only the thermosetting resin, the solid-state image sensor according to the present embodiment has an advantage that the pigment concentration can be increased and thus the first-color color filter is more likely to have a small thickness.

As illustrated in FIG. 1, the solid-state image sensor according to the present embodiment includes the semiconductor substrate 10 including the plurality of photoelectric conversion elements 11 two-dimensionally arranged, and the microlens 18. Between the semiconductor substrate 10 and the microlens 18, the solid-state image sensor according to the present embodiment includes the color filter layer 30 constituted by the color filters 14, 15, and 16 of the plurality of colors, the lower layer flattening layer 12 provided on part of the semiconductor substrate 10, and the upper layer flattening layer 13 provided on the surface of the color filter layer 30.

In the solid-state image sensor according to the second embodiment, components having configurations similar to those of the solid-state image sensor according to the first embodiment are given reference numerals which are the same as the reference numerals used in the first embodiment. Specifically, the semiconductor substrate 10 including the photoelectric conversion elements 11, the lower layer flattening layer 12, the color filters 14, 15, and 16, the upper layer flattening layer 13, and the microlens 18 have respective configurations similar to those of the solid-state image sensor according to the first embodiment. Thus, a detailed description of components in common with the components of the solid-state image sensor according to the first embodiment is omitted. The same applies to other embodiments.

<Method of Manufacturing Solid-State Image Sensor>

Next, the method of manufacturing the solid-state image sensor of the present embodiment will be described with reference to FIGS. 10(*a*)-10(*d*).

Figure 10:
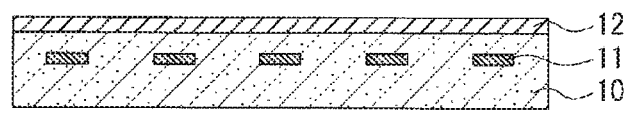
FIGS. 10(a)-10(d) are cross-sectional views illustrating, in order of steps, a process of producing a first-color color filter pattern according to a second embodiment of the present invention.
Figure 10:
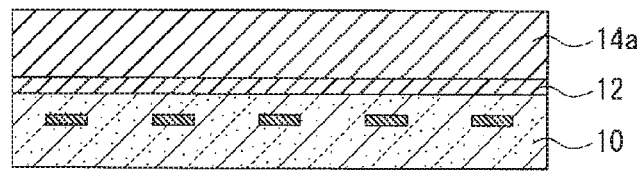
Figure 10:
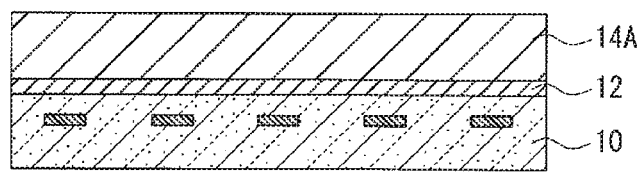
Figure 10:
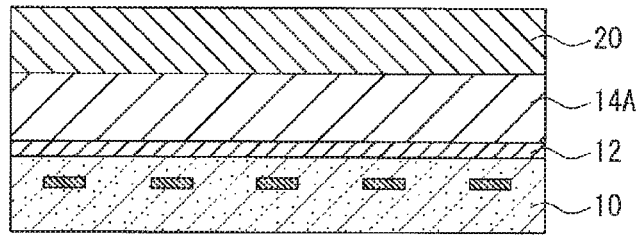
Figure 11A:
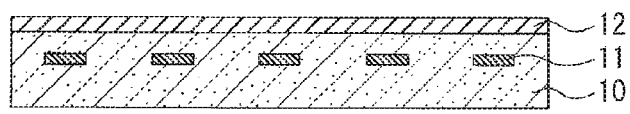
FIGS. 11(a)-11(d) are cross-sectional views illustrating, in order of steps, a process of producing a first-color color filter pattern according to a third embodiment of the present invention.
Figure 11B:
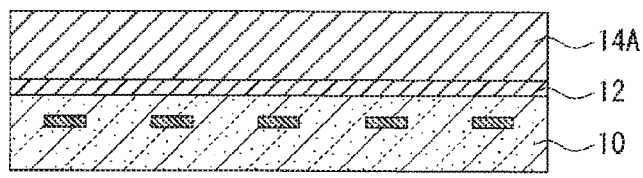
Figure 11C:
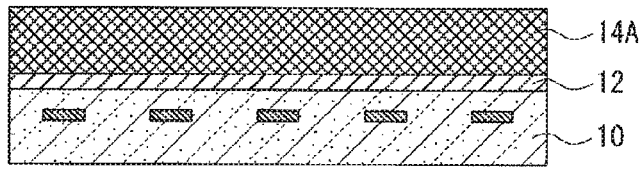
Figure 11D:
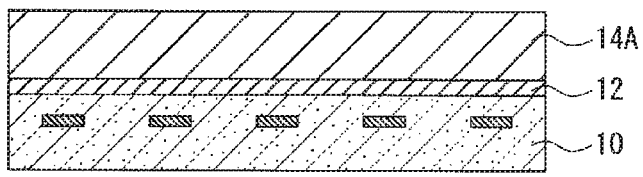

As illustrated in FIG. 10 (*a*), the lower layer flattening layer 12 is formed on the semiconductor substrate 10 including the plurality of photoelectric conversion elements 11 two-dimensionally arranged. The lower layer flattening layer 12 has an effect of improving adhesion of the color filter.

Next, as illustrated in FIGS. 10 (*b*) to 10 (*d*), the first-color color filter layer 14A is formed, and then the photosensitive resin mask layer 20 is formed on the first-color color filter layer 14A. The first-color color filter layer 14A of the present embodiment contains a thermosetting resin but no photocurable resin. As mentioned above, when the content percentage of the pigment in the color filter is increased, solvent resistance of the color filter may be reduced. Thus, a thermosetting resin having solvent resistance is used and heated at a high temperature to be heat cured with high crosslinking density. Specifically, a high temperature curing step at 230° C. or more is performed. More desirably, high temperature curing at 250° C. or more is performed at a later step for the device. On the first-color color filter layer 14A formed at the high temperature heating step, the photosensitive resin mask layer 20 is formed.

Next, the photosensitive resin mask layer 20 is exposed and developed by using a photomask so that portions where the second-color and third-color color filters are to be formed are opened. Thus, the etching mask 20 having openings is formed. Subsequent steps are similar to those of the first embodiment mentioned above.

According to the present embodiment, since the first-color color filter 14 contains only the thermosetting component but no photosensitive component, the present embodiment has an advantage that a high pigment concentration is more likely to be easily achieved. Furthermore, by setting the thermosetting temperature to the high temperature, the first-color color filter 14 can have higher solvent resistance.

In addition to the effects described in the first embodiment, the second embodiment of the disclosure further has the following effect. Since the first-color color filter 14 is formed of a thermosetting resin which is a thermosetting component, it is possible to easily achieve a high concentration of the pigment component and form the first-color color filter 14 having a small thickness and desired spectral characteristics.

Third Embodiment

A solid-state image sensor and a method of manufacturing the solid-state image sensor according to a third embodiment of the present invention will be described below with reference to FIGS. 11(a)-11(d).
<Configuration of Solid-State Image Sensor>
The solid-state image sensor according to the present embodiment is characterized in that the first-color color filter material contains only a photosensitive resin as a curable component. The configuration containing a photosensitive resin material is similar to that of the color filter forming step by photolithography using a photosensitive color resist of a conventional method. In the present embodiment, however, the photosensitive resin is used, but conventional patterning is not performed. Instead, photocuring by entire surface exposure is performed, followed by heat curing to evaporate water from the color filter by high temperature heating. Accordingly, as compared with the conventional method, the present embodiment can reduce the amount of photosensitive curable component and increase the pigment concentration. Thus, the present embodiment has an advantage that the first-color color filter 14 is more likely to have a small thickness.

A structure of the solid-state image sensor according to the present embodiment is similar to those of the first and second embodiments. However, the present embodiment differs from the first and second embodiments in a step during curing of the first-color color filter 14. Thus, a curing step and a patterning step for the first-color color filter 14 will be described.
<Method of Manufacturing Solid-State Image Sensor>
Next, the method of manufacturing the solid-state image sensor of the present embodiment will be described with reference to FIGS. 11(a)-11(d).

The lower layer flattening layer 12 is formed on the surface of the semiconductor substrate 10 illustrated in FIG. 11 (a).

Next, as illustrated in FIG. 11 (b), the first-color color filter layer 14A is formed by application on the lower layer flattening layer 12.

Next, as illustrated in FIG. 11 (c), an entire surface of the first-color color filter layer 14A is exposed to photocure the first-color color filter layer 14A.

At this time, when the first-color color filter layer 14A contains a sufficient amount of photosensitive component for curing of the first-color color filter layer 14A and has sufficient solvent resistance, a photosensitive resin mask material 40 illustrated in FIG. 12(b) is formed. After the photosensitive resin mask material 40 is patterned, portions where the second and subsequent color filters are to be formed are formed by dry etching, followed by high temperature heating. Thus, the first-color color filter 14 is heat cured.

On the other hand, when the first-color color filter layer 14A contains a photosensitive component insufficient for solvent resistance, as illustrated in FIG. 11 (d), it is desirable to perform a high temperature heating step at 200° C. or more to sufficiently cure the first-color color filter layer 14A. As compared with the case where the high temperature heating step is performed, in the former case where no high temperature heating step is performed, the first-color color filter layer 14A has a soft structure, and this facilitates etching at the dry etching step. Thus, an effect of reducing the probability of occurrence of a residue or the like is yielded.

Subsequent steps are similar to those described in the first embodiment mentioned above.

According to the present embodiment, instead of forming the first-color color filter 14 by patterning, the first-color color filter 14 is formed of the material containing only a sufficient amount of photosensitive component for photocuring. Accordingly, the amount of the photosensitive component of the color filter material in the conventional method can be simply reduced. Thus, the present embodiment has an advantage that the first-color color filter 14 can be easily produced and a high content percentage of pigment is more likely to be easily achieved. Furthermore, by setting the thermosetting temperature to the high temperature, the first-color color filter 14 can have higher solvent resistance.

Fourth Embodiment

<Configuration of Solid-State Image Sensor>
A basic configuration of a solid-state image sensor according to the present embodiment is similar to that of the first embodiment.

Figure 13:
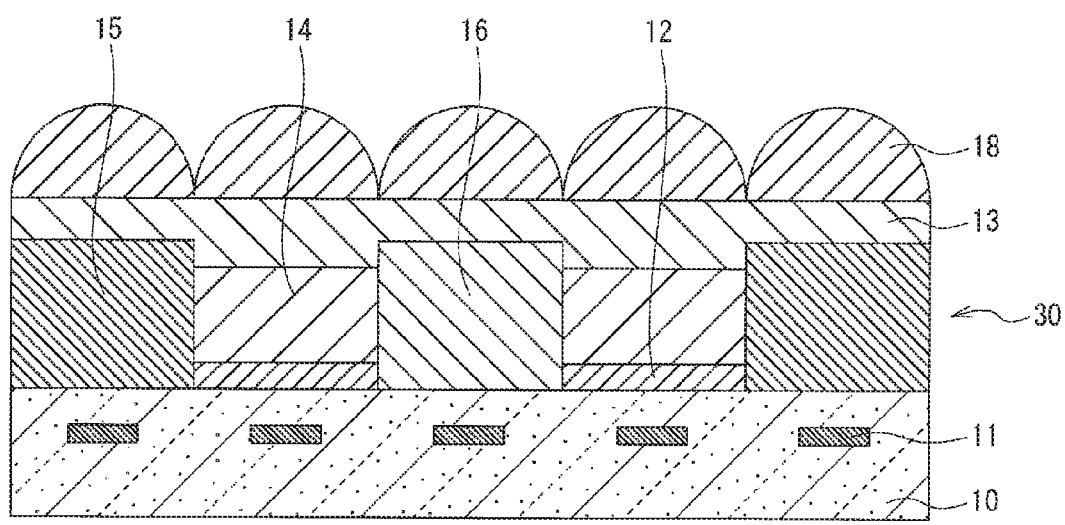
FIG. 13 is a cross-sectional view of a solid-state image sensor according to a fourth embodiment of the present invention.

In the present embodiment, however, as illustrated in FIG. 13, a level difference is present between adjacent color filters.

In the following description of the embodiment, the first color is assumed to be green, and the second color is assumed to be red.

In the present embodiment, the lower layer flattening layer 12 is formed to have a thickness B [nm] of 1 [nm] or more and 200 [nm] or less. The thickness B is preferably 100 [nm] or less, and more preferably 60 [nm] or less. From the viewpoint of color mixture prevention, a lower layer flattening layer 12 having a smaller thickness B is more preferable.

Also in the present embodiment, the solid-state image sensor including the color filters in the Bayer array illustrated in FIG. 2 will be described. However, the array of the color filters of the solid-state image sensor are not necessarily limited to be a Bayer array, and the colors of the color filters are not limited to the three RGB colors. Furthermore, a transparent layer having an adjusted refractive index may be arranged in part of the color filter array.

The first-color color filter 14 is formed to have a thickness A [nm] of 200 [nm] or more and 700 [nm] or less. The thickness A [nm] is preferably 400 [nm] or more and 600 [nm] or less. The thickness A [nm] is more preferably 500 [nm] or less.

The color filters 15 and 16 of the colors other than the first color are each formed to have a thickness satisfying the following formula (7), where C [nm] represents the thickness of the color filters 15 and 16.

$$A \text{ [nm]} < C \leq A+B+200 \text{ [nm]} \quad (7)$$

The color filters 15 and 16 are each preferably formed to have a thickness satisfying A+B [nm]<C≤A+B+200 [nm] (where B≥1 [nm]).

However, the thickness of the second-color color filter 15 may differ from the thickness of the third-color color filter 16. When the second color is red and the third color is blue, the red color filter preferably has a larger thickness than the green color filter.

Other configurations of the fourth embodiment are similar to those of the first embodiment.

<Method of Manufacturing Solid-State Image Sensor>

A method of manufacturing the solid-state image sensor of the fourth embodiment is similar to the method of manufacturing the solid-state image sensor of the first embodiment (see FIGS. 3 and 4) up to the step of forming the first-color color filter layer (first step).

Formation of patterns of the second and subsequent color filters of the fourth embodiment will be described below.

Next, as illustrated in FIGS. 14(a)-14(h), the second-color color filter 15 and the third-color color filter 16 containing the pigments of the colors different from that of the first-color color filter 14 are formed. The method of manufacturing the solid-state image sensor of the fourth embodiment is a pattern forming method in which the pattern of the first-color color filter 14 is used as a guide pattern to form the second-color color filter 15 and the third-color color filter 16 by using a photosensitive color filter material containing a photocurable resin and selectively exposing the photosensitive color filter material by the conventional method.

(Method of Forming Patterns of Second and Subsequent Color Filters (Second Step))

First, a first method of forming patterns of the second and subsequent color filters will be described with reference to FIGS. 14(a)-14(h). The first method is characterized in that a color filter material (color resist) containing a photosensitive component is used for the second-color color filter 15.

Figure 14:
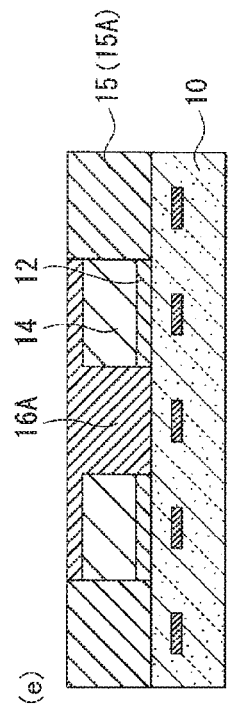
FIGS. 14(a)-14(h) are cross-sectional views illustrating, in order of steps, a process of producing second-color and third-color color filter patterns by photolithography according to the fourth embodiment of the present invention.
Figure 14:
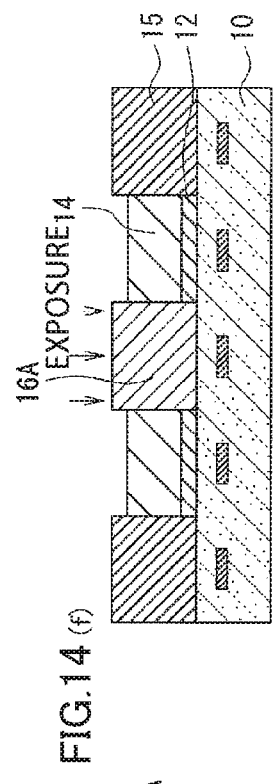
Figure 14:
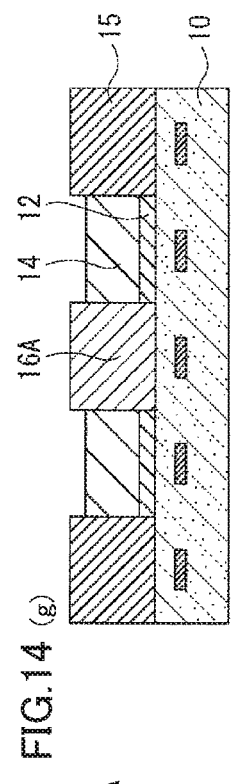
Figure 14:
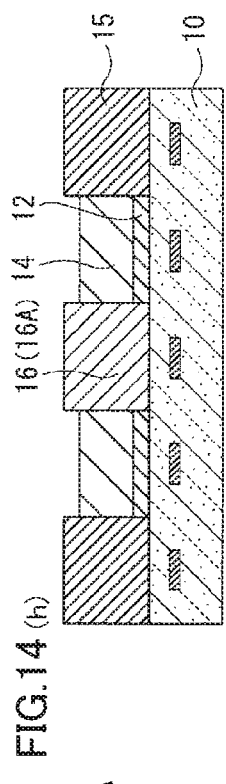
Figure 14:
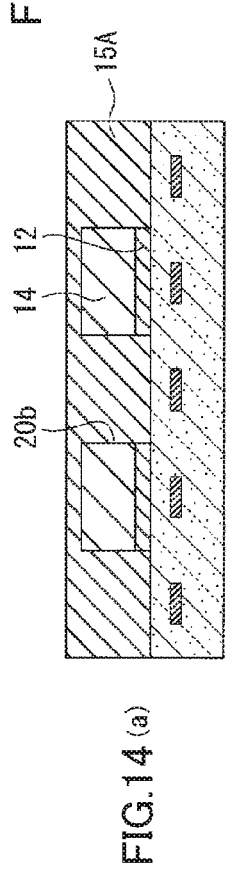
Figure 14:
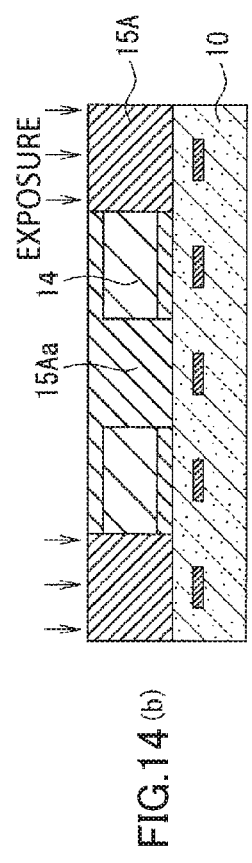
Figure 14:
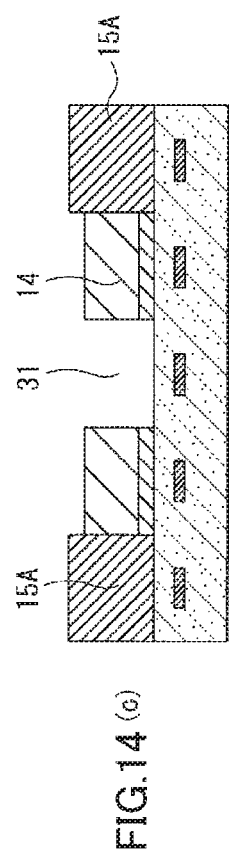
Figure 14:
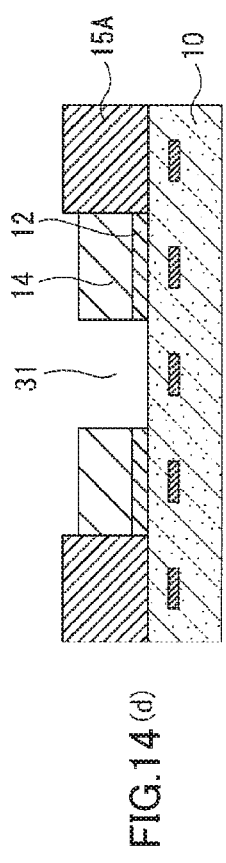

First, as illustrated in FIG. 14 (a), a photosensitive color filter material is applied as the second-color color filter material to the entire surface of the semiconductor substrate 10 on which the first-color color filter 14 has been formed by patterning, i.e., to the entire surface of the opening 20b, and is dried to form a second-color color filter layer 15A. The photosensitive color filter material used at this time contains a negative photosensitive component that is cured by being irradiated with light.

At this time, a thickness C1 [nm] of the second-color color filter 15 is set so that the following formulas (1), (6), and (7a) are satisfied, where A [nm] represents the thickness of the first-color color filter 14, B [nm] represents the thickness of the lower layer flattening layer 12, and C1 [nm] represents the thickness of the second-color color filter 15.

$$200 \text{ [nm]} \leq A \leq 700 \text{ [nm]} \quad (1)$$

$$0 \text{ [nm]} < B \leq 200 \text{ [nm]} \quad (6)$$

$$A < C \leq A+B+200 \text{ [nm]} \quad (7a)$$

When the second-color color filter 15 has the thickness C1 in the above range, in the second-color color filter 15 containing a thermosetting resin and a photocurable resin sufficient for curing, the pigment can be dispersed at a pigment concentration at which the second-color color filter 15 has desired spectral characteristics.

Next, as illustrated in FIG. 14 (b), a portion where the second-color color filter 15 is to be formed is exposed by using a photomask to photocure a part of the second-color color filter layer 15A.

Next, as illustrated in FIG. 14 (c), a part 15Aa (a position at which the third-color color filter is to be formed) of the second-color color filter layer 15A that has been selectively unexposed is removed at a development step to form an opening 31. Next, as illustrated in FIG. 14 (d), in order to improve adhesion between the exposed part of the second-color color filter layer 15A and the semiconductor substrate 10 and to improve heat resistance in actual use of the device, the remaining second-color color filter 15 is cured by performing a curing process by high temperature heating. Thus, the pattern of the second-color color filter 15 is formed. At this time, the temperature used for the curing is preferably 200° C. or more.

Next, as illustrated in FIG. 14 (e), the third-color color filter material is applied to the entire surface of the semiconductor substrate 10, i.e., entire surface of the opening formed in the second-color color filter 15, to form a third-color color filter layer 16A.

Next, as illustrated in FIG. 14 (f), a portion of the third-color color filter layer 16A where the third-color color filter 16 is to be formed is selectively exposed to photocure the portion of the third-color color filter layer 16A located at the opening 31.

Next, as illustrated in FIG. 14 (g), the photosensitive third-color color filter layer 16A is developed, and a part of the third-color color filter layer 16A that has not been exposed is removed. Next, as illustrated in FIG. 14 (h), in order to improve adhesion between the exposed part of the third-color color filter layer 16A and the semiconductor substrate 10 and to improve heat resistance in actual use of the device, the remaining third-color color filter layer 16A is cured by performing a curing process by high temperature heating. Thus, the third-color color filter 16 is formed.

Color filters of a desired number of colors can be formed by repeating the step of forming patterns of the third-color color filter 15 and the subsequent color filters.

At this time, a thickness C2 [nm] of the second-color color filter 16 is set so that the following formulas (1), (6), and (7b) are satisfied, where C2 [nm] represents the thickness of the third-color color filter 16.

$$200 \text{ [nm]} \leq A \leq 700 \text{ [nm]} \quad (1)$$

$$0 \text{ [nm]} < B \leq 200 \text{ [nm]} \quad (6)$$

$$A < C2 \leq A+B+200 \text{ [nm]} \quad (7b)$$

When the third-color color filter 16 has the thickness C2 in the above range, in the third-color color filter 16 containing a thermosetting resin and a photocurable resin sufficient for curing, the pigment can be dispersed at a pigment concentration at which the third-color color filter 16 has desired spectral characteristics.

Through the above steps, the color filters are formed so that a height of the second-color color filter 15 and the third-color color filter 16 has a value larger than a value of the thickness of the first-color color filter 14. In particular, the red color filter 15 preferably has a height having a value larger than a value obtained by adding the thickness of the first-color color filter 14 to the thickness of the lower layer flattening layer 12. In the present embodiment, the color filters are formed so that the height of the second-color color filter 15 and the third-color color filter 16 has a value larger than a value obtained by adding the thickness of the first-color color filter 14 to the thickness of the lower layer flattening layer 12.

Figure 15:
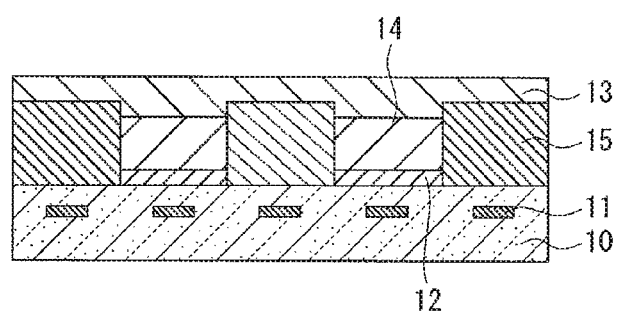
FIGS. 15(a) and 15(b) are cross-sectional views illustrating, in order of steps, a process of producing a microlens by photolithography according to the fourth embodiment of the present invention.
Figure 15:
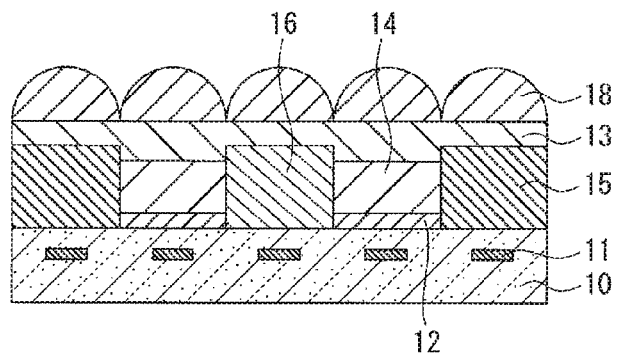

Next, as illustrated in FIG. 15 (*a*), the upper layer flattening layer 13 is formed on the formed color filters 14, 15, and 16. For example, the upper layer flattening layer 13 can be formed by using a resin containing one or more of the resin materials such as an acrylic resin mentioned above. In this case, the upper layer flattening layer 13 can be formed by applying the resin material to the surface of the semiconductor substrate 10, followed by curing the resin material by heating. Alternatively, for example, the upper layer flattening layer 13 can be formed by using a compound such as the oxide or the nitride mentioned above. In this case, the upper layer flattening layer 13 can be formed by various film forming methods such as vapor deposition, spattering, and CVD.

Finally, as illustrated in FIG. 15 (*b*), the microlens 18 is formed on the upper layer flattening layer 13. The microlens 18 is formed by a publicly known technique such as a production method by thermal flow, a microlens production method using a gray tone mask, or a microlens transfer method to the upper layer flattening layer 13 using dry etching.

For example, the upper layer flattening layer 13 has a thickness of 1 [nm] or more and 300 [nm] or less. The upper layer flattening layer 13 preferably has a thickness of 100 [nm] or less, and more preferably of 60 [nm] or less.

Figure 16:
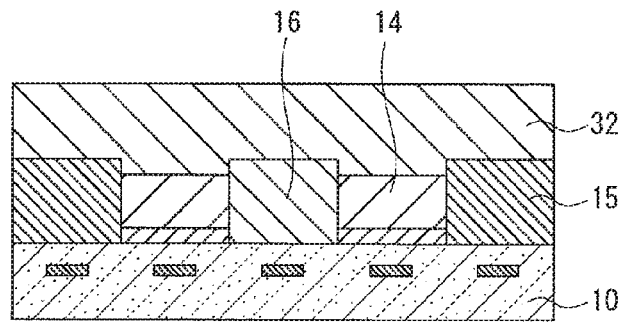
FIGS. 16(a)-16(c) are cross-sectional views illustrating, in order of steps, a process of producing a microlens by a transfer method using etchback according to the fourth embodiment of the present invention.
Figure 16:
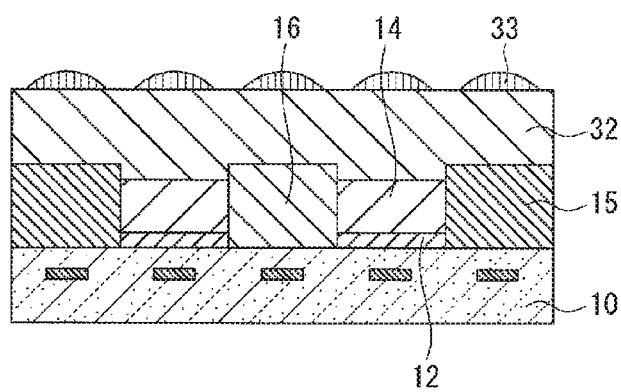
Figure 16:
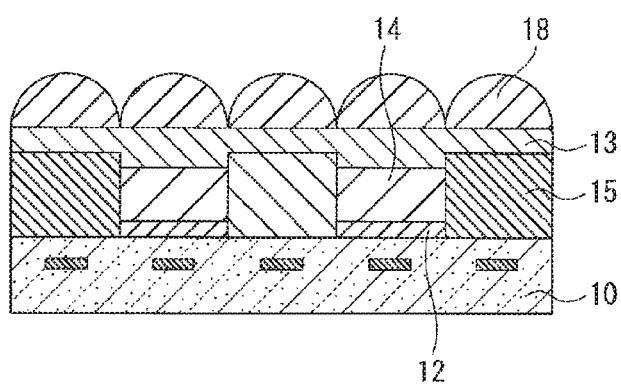

In a method of forming a microlens by using a patterning technique by dry etching with good shape controllability, as illustrated in FIG. 16 (*a*), first, a transparent resin layer 32 (which may also serve as the upper layer flattening layer 13) which is to be a microlens at the end is formed on the color filters.

Next, as illustrated in FIG. 16 (*b*), a matrix 33 (lens matrix) of the microlens is formed on the transparent resin layer 32 by a thermal flow method. Next, as illustrated in FIG. 16 (*c*), a shape of the lens matrix is transferred to the transparent resin layer 32 by a dry etching method using the lens matrix 33 as a mask. A proper lens shape can be transferred to the transparent resin layer 32 by selecting a height and a material of the lens matrix 33 and adjusting a condition for the etching.

By the above method, a microlens can be formed with good controllability. It is desirable to use the above method to produce a microlens so that a height from a lens top to a lens bottom of the microlens is in the range of 400 to 800 nm.

Through the steps described above, the solid-state image sensor of the present embodiment is completed.

In the present embodiment, the first-color color filter 14 is preferably the color filter that occupies a largest area. Then, the second-color color filter 15 and the third-color color filter 16 are each formed by photolithography using a photosensitive color resist.

The technique using a photosensitive color resist is a conventional technique of manufacturing a color filter pattern. Since the first-color color filter material is applied to the entire surface of the lower layer flattening layer 12 and then heated at a high temperature, the semiconductor substrate 10 can be very strongly adhered to the lower layer flattening layer 12. Accordingly, by using the pattern of the first-color color filter 14 with good adhesion and good rectangularity as the guide pattern, the second-color color filter 15 and the third-color color filter 16 can be formed so as to fill an area whose four sides are surrounded. Thus, even when a photosensitive color resist is used for the second and subsequent color filters, unlike the conventional technique, the photosensitive color resist does not need to be a color resist in which emphasis is placed on resolution performance. Accordingly, the amount of the photocurable component in the photocurable resin can be made small, and thus a ratio of the pigment in the color filter material can be made large. This enables the color filters 15 and 16 to have a small thickness.

At the portions where the second and subsequent color filters are to be formed, the lower layer flattening layer 12 has been removed at the etching step during the etching of the first-color color filter 14, so that the semiconductor substrate 10 is exposed at the surface. In this case, the surface of the semiconductor substrate 10 may have been oxidized and have become hydrophilic. If the second and subsequent color filters are formed on the surface of the semiconductor substrate 10 by a photolithography process, a developing solution reaches a portion at which the hydrophilic semiconductor substrate 10 is in contact with the second and subsequent color filters. Accordingly, the second and subsequent color filters (the second-color color filter 15 and the third-color color filter 16) are assumed to be peeled off Thus, the possibility of peeling-off of the second and subsequent color filters can be reduced by, depending on a state of the surface of the semiconductor substrate 10, causing the exposed surface of the semiconductor substrate 10 to be hydrophobic by an existing method, for example, by a method such as HMDS (hexamethyldisilazane) treatment.

The present embodiment is characterized in that the second and subsequent color filters have a large thickness relative to the first-color color filter. The first-color color filter 14 is desirably formed of a color filter material in which a content percentage of a resin component and the like involved in photocuring is low and a content percentage of a pigment is high. In particular, the content percentage of the pigment in the first-color color filter material is desirably 70% by mass or more. Thus, even when the first-color color filter material contains pigment at a concentration at which curing is insufficient in a conventional photolithography process using a photosensitive color resist, the first-color color filter 14 can be formed with good precision and with no residue or peeling-off. Specifically, by using, as the first-color color filter 14, the green filter, in which it is most difficult to have a high content percentage of pigment in the photosensitive color resist of the conventional method, and by forming the red filter or the blue filter to have a thickness as in the conventional method, an effect of easily achieving desired spectral characteristics can be expected.

When the green filter is used as the first-color color filter and the red and blue filters are used as the second-color and third-color color filters, by forming the first-color color filter with good rectangularity by dry etching, a signal intensity of the green filter is increased. Due to the refractive index of the filters to light, light tends to be bent from the green filter toward the red filter and from the blue filter toward the green filter. Since the second-color and third-color color filters protrude upward, a signal intensity of the red filter can be expected to be increased, and thus an effect of color mixture prevention is increased.

The first-color color filter 14 formed first is formed by using the first-color color filter material in which emphasis is placed not on pattern formation but on photocuring and only a small amount of photosensitive component is used, and in which the principal focus is on curing of the thermosetting component. Thus, the first-color color filter 14 is adhered to the semiconductor substrate 10 and the lower layer flattening layer 12, and no residue or peeling-off occurs in the first-color color filter 14 during formation of other color filters. Furthermore, the first-color color filter 14 can have high resolution. Then, the second-color color filter 15 and the third-color color filter 16 are formed by using the photosensitive second-color and third-color color filter materials by an efficient photolithography method involving a small number of steps. Thus, the pattern of the first-color color filter 14 formed first serves as an accurate pattern guide, and the patterns of the second-color color filter 15 and the third-color color filter 16 having a good shape can be formed by photolithography.

As has been described, according to the present embodiment, the color filters other than the first-color color filter can have a relatively larger thickness than the first-color color filter by the thickness of the lower layer flattening layer not being provided on the lower side of the color filters other than the first-color color filter. Accordingly, the color filters can have a small overall thickness, while the conventional color filter material having a low content percentage of pigment is continuously used for the color filters other than the first-color color filter. This makes it possible to provide a high-definition solid-state image sensor in which less color mixture occurs.

Figure 17:
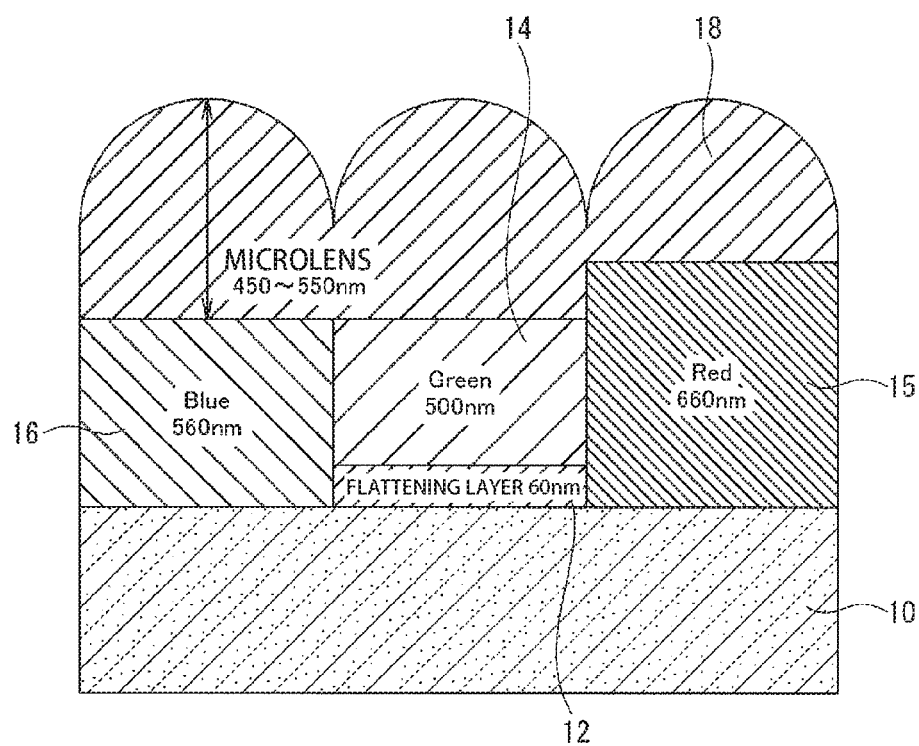
FIG. 17 is a cross-sectional view of a solid-state image sensor of another example according to the fourth embodiment of the present invention.

In the above description, FIG. 13 illustrates, as an example, the case where the thicknesses of the second-color color filter 15 and the third-color color filter 16 are both larger than the thickness obtained by adding the thickness of the first-color color filter to the thickness of the lower layer flattening layer 12. As illustrated in FIG. 17, however, an upper surface of the blue color filter may be flush with an upper surface of the green color filter. FIGS. 8(*a*)-8(*g*) illustrate the example in which the upper flattening layer is omitted.

An order in which the second and subsequent color filters are formed may be set so that a color filter having a relatively small thickness is formed earlier.

Conventionally, there has been a problem in which a color filter material having a higher content percentage of pigment has lower solvent resistance and is changed in spectral characteristics. Furthermore, when color filters of three or more colors constituting the color filter layer are formed by patterning at a dry etching step, the number of steps is increased, and a residue may be generated multiple times in the dry etching. On the other hand, when the second and subsequent color filters are produced by lithography, the formation of color filters having a small thickness reaches the limitations in terms of the content and a patterning property of the photosensitive resin, and it becomes difficult for the second and subsequent color filters to have a small thickness similarly to the first-color color filter.

In view of the above problems, the fourth embodiment provides a high-definition solid-state image sensor which has good sensitivity and is easily manufactured and in which less color mixture occurs.

Specifically, according to the fourth embodiment, the color filters other than the first-color color filter can have a relatively larger thickness than the first-color color filter by the thickness of the lower layer flattening layer not being provided on the lower side of the color filters other than the first-color color filter. Accordingly, the color filters can have a small overall thickness, while the conventional color filter material having a low content percentage of pigment is continuously used for the color filters other than the first-color color filter. As a result, it is possible to provide a high-definition solid-state image sensor in which less color mixture occurs.

Modified Examples of Fourth Embodiment (1) In the method of manufacturing the solid-state image sensor according to the fourth embodiment, the solid-state image sensor may be manufactured by employing a step of curing the first-color color filter similar to that of the second embodiment (see FIGS. 10(*a*)-10(*d*)). Effects and the like are similar to those of the third embodiment.

(2) In the method of manufacturing the solid-state image sensor according to the fourth embodiment, the method of manufacturing the solid-state image sensor according to the third embodiment (see FIGS. 11 and 12) may be employed.

The solid-state image sensor is characterized in that the first-color color filter material contains only a photosensitive resin as a curable component. The configuration containing a photosensitive resin material is similar to that of the color filter forming step by photolithography using a photosensitive color resist of a conventional method. In the present embodiment, however, the photosensitive resin is used, but conventional patterning is not performed. Instead, photocuring by entire surface exposure is performed, followed by heat curing to evaporate water from the color filter by high temperature heating. Accordingly, as compared with the conventional method, the present embodiment can reduce the amount of photosensitive curable component and increase the pigment concentration. Thus, the present embodiment has an advantage that the first-color color filter 14 is more likely to have a small thickness.

The modified examples differ from the above embodiments in a step during curing of the first-color color filter 14.

Effects and the like are similar to those of the third embodiment.

EXAMPLES

The solid-state image sensors according to the embodiments of the present invention will be specifically described below with examples.

Example A

First, Example A will be described.

Example A is an example based on the first to third embodiments.

Example 1-1

A coating liquid containing an acrylic resin was spin coated at a rotational speed of 2000 rpm on a semiconductor substrate including photoelectric conversion elements two-dimensionally arranged, and was heat treated at 200° C. for 20 minutes by means of a hot plate to cure the resin. Thus, a lower layer flattening layer was formed on the semiconductor substrate. At this time, the lower layer flattening layer had a thickness of 60 nm.

Next, as a first-color color filter material containing a green pigment which was a first color, a green pigment dispersion containing a photosensitive curable resin and a thermosetting resin was spin coated at a rotational speed of 1000 rpm. The green pigment of the first-color color filter material was C.I. PG 58 in the Color Index. A concentration of the green pigment in the first-color color filter material was 70% by mass, and a thickness of the first-color color filter material was 500 nm.

Next, in order to cure the first-color color filter material, an entire surface was exposed by means of a stepper which was an i-line exposure apparatus, to cure the photosensitive component. By curing the photosensitive component, the surface of the color filter was cured. Subsequently, the color filter was baked at 230° C. for 6 minutes to thermally cure the green filter layer.

Next, a positive resist (OFPR-800: manufactured by Tokyo Ohka Kogyo Co., Ltd.) was spin coated at a rotational speed of 1000 rpm by means of a spin coater, followed by prebake at 90° C. for 1 minute. Thus, a sample was produced in which the photoresist which was a photosensitive resin mask material layer was applied with a thickness of 1.5 μm.

The positive resist which was the photosensitive resin mask material layer was a positive resist that was to be dissolved in a developing solution by a chemical reaction when irradiated with ultraviolet light.

The sample was exposed through a photomask by photolithography. The exposure was performed by using an exposure apparatus including a light source with an i-line wavelength.

Next, a development step was performed by using, as a developing solution, 2.38% by mass of TMAH (tetramethylammonium hydride) to form an etching mask having openings at positions at which second and third color filters are to be formed. When a positive resist is used, development is very often followed by dehydration baking to cure the photoresist which is a photosensitive resin mask material layer. This time, however, in order to facilitate removal of the etching mask after dry etching, no bake step was performed. Accordingly, the resist was not cured and a selection ratio was not expected to be increased. Thus, the resist was formed to have a thickness of 1.5 μm, which was more than twice the thickness of the first-color color filter which was the green filter. An opening pattern at this time was 1.1 μm×1.1 μm.

Next, dry etching was performed by using the formed etching mask. At this time, a parallel plate type dry etching apparatus was used. In order not to influence the semiconductor substrate which was a base, the dry etching was performed in stages by changing an etching condition during the dry etching.

First, etching was performed by using a mixture of three types of gasses, i.e., $CF_4$ gas, $O_2$ gas, and Ar gas. A flow rate of each of the $CF_4$ gas and the $O_2$ gas was set to 5 ml/min, and a flow rate of the Ar gas was set to 200 ml/min. Specifically, the Ar gas flow rate in a total gas flow rate was 95.2%. At this time, the etching was performed at a chamber internal pressure of 1 Pa and an RF power of 500 W. When approximately 350 nm, which was 70% of the total thickness of 500 nm of the green filter layer, was etched under this condition, the etching condition was changed to a next etching condition.

Next, etching was performed by using a mixture of three types of gasses, i.e., $CF_4$ gas, $O_2$ gas, and Ar gas. A flow rate of each of the $CF_4$ gas and the $O_2$ gas was set to 25 ml/min, and a flow rate of the Ar gas was set to 50 ml/min. Specifically, the Ar gas flow rate in a total gas flow rate was 50%. At this time, the etching was performed at a chamber internal pressure of 5 Pa and an RF power of 300 W. Under this condition, the etching was performed so as to remove a reaction product adhered to a side surface of the photoresist which was the etching mask. Under this condition, approximately 450 nm, which was 90% of the total thickness of 500 nm of the first-color color filter layer of green, was etched. In the second stage, an etching amount was approximately 100 nm. Since the flow rate of the $CF_4$ gas and the $O_2$ gas was increased, an etching rate was approximately 5 nm/sec, and the etching proceeded very rapidly.

Next, etching was performed by using an Ar gas alone at an Ar gas flow rate of 200 ml/min, a chamber internal pressure of 1.5 Pa, and an RF power of 400 W. By performing the etching under these conditions, the remaining portion of the green filter layer was etched, and simultaneously, the lower layer flattening layer was etched. In the etching under the condition using the Ar gas alone, a main reaction was physical impact caused by ions. Accordingly, a chemical reaction of the green filter enabled effective removal of a residue that remained without being etched. This etching condition was also intended to adjust a difference in etching rate in a plane of the etching sample, and the etching was performed so that an overetching amount was 10%. In other words, a thickness of 550 nm, which was 110% of the total thickness of 500 nm of the green color filter material, was etched under the three-stage condition.

Next, etching was performed by using an O2 gas alone at an O2 gas flow rate of 100 ml/min, a chamber internal pressure of 15 Pa, and an RF power of 150 W. Under this condition, together with removal of a damaged and altered layer on a surface which was a top of the etching mask, a residue of the green color filter material that had not been removed by the Ar gas alone and had remained at a bottom was etched.

Next, the photosensitive resin mask material used as the etching mask was removed. At this time, a method using a solvent was employed, and the resist was removed by means of a spray cleaning apparatus using a stripping solution 104 (manufactured by Tokyo Ohka Kogyo Co., Ltd.).

(Production of Second-Color Color Filter)

Next, a step of forming a second-color color filter was performed. At portions where second-color and third-color color filters were to be formed, the lower layer flattening layer 12 was removed at the step of forming the first-color color filter, so that the semiconductor substrate 10 was exposed. On the surface of the semiconductor substrate 10, a surface protective layer of $SiO_2$ or the like was provided, and thus the surface was hydrophilic. Accordingly, a developing solution may reach the surface at a development step, and this may cause peeling-off of the second-color color filter. Thus, in order to cause the exposed semiconductor substrate 10 to be hydrophobic, HMDS treatment was performed.

Next, in order to form the second-color color filter, a photosensitive second-color color filter material containing a blue pigment dispersion was applied to the entire surface of the semiconductor substrate.

Next, the photosensitive second-color color filter material was selectively exposed by photolithography.

Next, the photosensitive color filter material was developed to form a blue filter. At this time, pigments used for the photosensitive color filter material of the blue resist were C.I. PB 156 and C.I. PV 23 in the Color Index, and a pigment concentration was 50% by mass. The blue color filter had a thickness of 0.56 μm. Furthermore, a photosensitive acrylic resin was used as a resin which was a main component of the blue resist.

Next, in order to strongly cure the photosensitive second-color color filter material which was to be the second-color color filter (blue filter), the photosensitive second-color color filter material was placed in an oven at 230° C. for 30 minutes to be cured. Once the second-color color filter was subjected to this heating step, no peeling-off, pattern deformation, or the like was confirmed even when the second-color color filter was subjected to steps such as a step of forming a third-color color filter. A periphery of the second-color color filter was surrounded by the first-color color filter with good rectangularity, and the second-color color filter was formed with good rectangularity. Thus, the second-color color filter was confirmed to have been cured with good adhesion to the bottom and the surrounding filter.
(Production of Third-Color Color Filter)

Next, a photosensitive third-color color filter material containing a red pigment dispersion was applied to the entire surface of the semiconductor substrate.

Next, a pattern of a photomask was selectively exposed on the photosensitive third-color color filter material by photolithography.

Next, the photosensitive third-color color filter material was developed to form a third-color color filter of red.

At this time, pigments used for the red resist were C.I. PR 254 and C.I. PY 139 in the Color Index, and a pigment concentration was 60% by mass. The third-color color filter had a thickness of 0.56 µm.

Next, in order to strongly cure the photosensitive third-color color filter material of red which was to be the third-color color filter, the photosensitive third-color color filter material was placed in an oven at 230° C. for 20 minutes to be cured. At this time, a periphery of the third-color color filter was surrounded by the first-color color filter with good rectangularity, and the third-color color filter was formed with good rectangularity. Thus, the third-color color filter was confirmed to have been cured with good adhesion to the bottom and the surrounding filter.

Through the above steps, the color filters were formed so that a thickness A (500 nm) of the first-color color filter which was the green filter, a thickness B (60 nm) of the flattening layer below the first-color color filter, and a thickness C (560 nm) of the second-color and third-color color filters which were the blue and red filters were thicknesses according to the present disclosure.

Next, on the color filters formed in the above process flow, a coating liquid containing an acrylic resin was spin coated at a rotational speed of 1000 rpm, and was heat treated at 200° C. for 30 minutes by means of a hot plate to cure the resin. Thus, an upper layer flattening layer was formed.

Finally, on the upper layer flattening layer, a microlens having a height from a lens top to a lens bottom of 500 nm was formed by the above-mentioned transfer method using etchback which was the publicly known technique. Thus, a solid-state image sensor of Example 1-1 was completed.

In the solid-state image sensor obtained as described above, the thin lower layer flattening layer was provided at the lower portion of the first-color color filter, and the second-color and third-color color filters were provided on the semiconductor substrate. Since the thermosetting resin and the small amount of photosensitive curable resin were used for the green filter which was the first-color color filter, a high pigment concentration in the solid content was achieved, and thus a color filter having a small thickness was formed. Furthermore, the photosensitive resin was used for the blue and red filters which were the second-color and third-color color filters. In the solid-state image sensor, therefore, a distance to the semiconductor substrate below the microlens was small, and thus the solid-state image sensor had good sensitivity.

Furthermore, the inside of the color filter material of the first-color color filter which was the green filter was cured by thermal curing, and further the surface of the color filter material of the first-color color filter was cured by exposure using the small amount of photosensitive resin. Accordingly, the color filter material of the first-color color filter had improved solvent resistance. When a green filter material having a high content percentage of pigment is used, the green filter material may react with a solvent or other color filter materials, and this may change spectral characteristics of the green filter material. Thus, the use of the thermal curing and the photocuring in combination improved hardness, and had an effect of preventing a change in the spectral characteristics.

Example 1-2

Example 1-2 is an example corresponding to the solid-state image sensor having the configuration described in the second embodiment.

As a first-color color filter material of a solid-state image sensor of Example 1-2, no photocurable resin was used and only a thermosetting resin was used. The use of only the thermosetting resin can achieve a high pigment concentration and formation of a color filter having a small thickness.
(Formation of Lower Layer Flattening Layer)

A coating liquid containing an acrylic resin was spin coated at a rotational speed of 2000 rpm on a semiconductor substrate, and was heat treated at 200° C. for 20 minutes by means of a hot plate to cure the resin. Thus, a lower layer flattening layer was formed. At this time, the lower layer flattening layer had a thickness of 60 nm.
(Formation of First-Color Color Filter)

As the color filter material of the first-color color filter (green filter), a green pigment dispersion containing a thermosetting resin but no photosensitive resin was prepared. The green pigment dispersion was spin coated at a rotational speed of 1000 rpm on a surface of the lower layer flattening layer. A thermosetting acrylic resin was used as a resin which was a main component of the green pigment dispersion. As a green pigment contained in the green pigment dispersion, C.I. PG 58 in the Color Index was used, and the concentration of the green pigment in the green pigment dispersion was 70% by mass. The green color filter material was applied with a thickness of 500 nm.

Next, the green color filter was baked at 250° C. for 6 minutes to cure the green filter material, and thus a green filter layer was formed. By baking the green color filter at a high temperature of 250° C., a crosslinking density of the thermosetting resin was increased, and thus the green pigment was more strongly cured.
(Formation of First-Color Color Filter)

By the method shown in Example 1-1, a photosensitive resin mask material was patterned to form an etching mask.

First, etching was performed by using a mixture of three types of gasses, i.e., $CF_4$ gas, $O_2$ gas, and Ar gas. A flow rate of each of the $CF_4$ gas and the $O_2$ gas was set to 5 ml/min, and a flow rate of the Ar gas was set to 200 ml/min. The etching was performed at a chamber internal pressure of 1 Pa and an RF power of 500 W. When approximately 350 nm, which was 70% of the total thickness of 500 nm of the green filter material, was etched under this condition, the etching condition was changed to a next etching condition.

Next, etching was performed by using an etching gas containing a mixture of three types of gasses, i.e., $CF_4$ gas, $O_2$ gas, and Ar gas. At this time, a flow rate of each of the $CF_4$ gas and the $O_2$ gas was set to 25 ml/min, and a flow rate of the Ar gas was set to 50 ml/min. At this time, the etching was performed at a chamber internal pressure of 5 Pa and an RF power of 300 W. Under this condition, the etching was performed so as to remove a reaction product adhered to a side surface of the photoresist which was the etching mask. Under this condition, approximately 450 nm, which was 90% of the total thickness of 500 nm of the first-color color filter layer (green filter), was etched. In the second stage, an etching amount was approximately 100 nm. Since the flow rate of the $CF_4$ gas and the $O_2$ gas was increased, an etching rate was approximately 5 nm/sec, and the etching proceeded very rapidly.

Next, etching was performed by using an Ar gas alone at an Ar gas flow rate of 200 ml/min, a chamber internal pressure of 1.5 Pa, and an RF power of 400 W. By performing the etching under this condition, the remaining portion of the green color filter material was etched, and simultaneously, the lower layer flattening layer was etched. In the etching under the condition using the Ar gas alone, a main reaction was physical impact caused by ions. Accordingly, a chemical reaction of the green filter enabled effective removal of a residue that remained without being etched.

This etching condition was also intended to adjust a difference in etching rate in a plane of the etching sample, and the etching was performed so that an overetching amount was 10%. In other words, a thickness of 550 nm, which was 110% of the total thickness of 500 nm of the green filter material, was etched under the three-stage condition.

Next, etching was performed by using an $O_2$ gas alone at an $O_2$ gas flow rate of 100 ml/min, a chamber internal pressure of 15 Pa, and an RF power of 150 W. Under this condition, together with removal of a damaged and altered layer on a surface which was a top of the etching mask, a residue of the green filter layer that had not been removed by the Ar gas alone and had remained at a bottom was etched.

Next, the photosensitive resin mask material used as the etching mask was removed. At this time, a method using a solvent was employed, and the resist was removed by means of a spray cleaning apparatus using a stripping solution 104 (manufactured by Tokyo Ohka Kogyo Co., Ltd.).
(Production of Second-Color and Third-Color Color Filters and the Like)

In Example 1-2, then, second-color and third-color color filters, an upper layer flattening layer, and a microlens were formed by a method similar to that of Example 1-1. Thus, the solid-state image sensor of Example 1-2 was formed.

Through the above steps, similarly to Example 1-1, also in Example 1-2, the color filters were formed so that a thickness A (500 nm) of the green filter which was the first-color color filter, a thickness B (60 nm) of the flattening layer below the green filter, and a thickness C (560 nm) of the blue and red filters which were the second-color and third-color color filters satisfied the thicknesses defined in the present invention.

Example 1-3

Example 1-3 is an example corresponding to the solid-state image sensor having the configuration described in the third embodiment.

As a first-color color filter material of a solid-state image sensor of Example 1-3, no thermosetting resin was used and only a photocurable resin was used. However, unlike a conventional step as described later at which a photosensitive color resist was patterned, the first-color color filter material can be cured by entire surface exposure. This can achieve a high content percentage of pigment and formation of a color filter having a small thickness.

(Formation of Lower Layer Flattening Layer)
A coating liquid containing an acrylic resin was spin coated at a rotational speed of 2000 rpm on a semiconductor substrate, and was heat treated at 200° C. for 20 minutes by means of a hot plate to cure the resin. Thus, a lower layer flattening layer was formed. At this time, the lower layer flattening layer had a thickness of 60 nm.
(Formation of First-Color Color Filter)

As the color filter material of the first-color color filter (green filter), a green pigment dispersion containing a photosensitive resin but no thermosetting resin was prepared. The green pigment dispersion was spin coated at a rotational speed of 1000 rpm on a surface of the lower layer flattening layer. A photocurable acrylic resin was used as a resin which was a main component of the green pigment dispersion. As a green pigment contained in the green pigment dispersion, C.I. PG 58 in the Color Index was used, and the concentration of the green pigment in the green pigment dispersion was 70% by mass. The green color filter material was applied with a thickness of 500 nm.

Next, an entire surface of the wafer was exposed by means of an i-line stepper exposure apparatus to photocure the green filter material.

Next, the photocured green filter was baked at 230° C. for 6 minutes to cure the green filter material, and thus a green filter layer was formed.

Next, a positive resist (OFPR-800: manufactured by Tokyo Ohka Kogyo Co., Ltd.) was spin coated at a rotational speed of 1000 rpm on a surface of the green filter layer by means of a spin coater, followed by prebake at 90° C. for 1 minute. Thus, a sample was produced in which the photoresist which was a photosensitive resin mask material was applied with a thickness of 1.5 µm.

The positive resist which was the photosensitive resin mask material was a positive resist that was to be dissolved in a developing solution by a chemical reaction when irradiated with ultraviolet light.

Next, the sample was exposed through a photomask by photolithography. The exposure was performed by using an exposure apparatus including a light source with an i-line wavelength.

Next, a development step was performed by using, as a developing solution, 2.38% by mass of TMAH (tetramethylammonium hydride) to form a photoresist having openings at positions at which second and third color filters are to be formed. When a positive resist is used, development is very often followed by dehydration baking to cure the photoresist which is a photosensitive resin mask material. This time, however, in order to facilitate removal of the etching mask after dry etching, no bake step was performed. Accordingly, the resist was not cured and a selection ratio was not expected to be increased. Thus, the photoresist was formed to have a thickness of 1.5 µm, which was more than twice the thickness of the first-color color filter which was the green filter. A size of the opening at this time was 1.1 µm×1.1 µm.

Next, dry etching was performed by using the formed photosensitive resin mask material layer as an etching mask. At this time, a parallel plate type dry etching apparatus was used. In order not to influence the semiconductor substrate which was a base, the dry etching was performed in stages.

Etching was performed by using a mixture of three types of gasses, i.e., $CF_4$ gas, $O_2$ gas, and Ar gas. A flow rate of each of the $CF_4$ gas and the $O_2$ gas was set to 5 ml/min, and a flow rate of the Ar gas was set to 200 ml/min. The etching was performed at a chamber internal pressure of 1 Pa and an RF power of 500 W. When approximately 350 nm, which was 70% of the total thickness of 500 nm of the green filter material, was etched under this condition, the etching condition was changed to a next etching condition.

Next, etching was performed by using an etching gas containing a mixture of three types of gasses, i.e., $CF_4$ gas, $O_2$ gas, and Ar gas. At this time, a flow rate of each of the $CF_4$ gas and the $O_2$ gas was set to 25 ml/min, and a flow rate of the Ar gas was set to 50 ml/min. At this time, the etching was performed at a chamber internal pressure of 5 Pa and an RF power of 300 W. Under this condition, the etching was performed so as to remove a reaction product adhered to a side surface of the photoresist which was the etching mask. Under this condition, approximately 450 nm, which was 90% of the total thickness of 500 nm of the first-color color filter layer of green, was etched. In the second stage, an etching amount was approximately 100 nm. Since the flow rate of the $CF_4$ gas and the $O_2$ gas was increased, an etching rate was approximately 5 nm/sec, and the etching proceeded very rapidly.

Next, etching was performed by using an Ar gas alone at an Ar gas flow rate of 200 ml/min, a chamber internal pressure of 1.5 Pa, and an RF power of 400 W. By performing the etching under these conditions, the remaining portion of the green filter layer was etched, and simultaneously, the lower layer flattening layer was etched. In the etching under the condition using the Ar gas alone, a main reaction was physical impact caused by ions. Accordingly, a chemical reaction of the green filter enabled effective removal of a residue that remained without being etched. This etching condition was also intended to adjust a difference in etching rate in a plane of the etching sample, and the etching was performed so that an overetching amount was 10%. In other words, a thickness of 550 nm, which was 110% of the total thickness of 500 nm of the green color filter material, was etched under the three-stage condition.

Next, etching was performed by using an $O_2$ gas alone at an $O_2$ gas flow rate of 100 ml/min, a chamber internal pressure of 15 Pa, and an RF power of 150 W. Under this condition, together with removal of a damaged and altered layer on a surface which was a top of the etching mask, a residue of the green color filter film that had not been removed by the Ar gas alone and had remained at a bottom was etched.

Next, the photosensitive resin mask material used as the etching mask was removed. At this time, a method using a solvent was employed, and the resist was removed by means of a spray cleaning apparatus using a stripping solution 104 (manufactured by Tokyo Ohka Kogyo Co., Ltd.).
(Production of Second-Color and Third-Color Color Filters and the Like)

In Example 1-3, then, second-color and third-color color filters, an upper layer flattening layer, and a microlens were formed by a method similar to that of Example 1-1. Thus, the solid-state image sensor of Example 1-3 was formed.

Through the above steps, similarly to Example 1-1, also in Example 1-3, the color filters were formed so that a thickness A (500 nm) of the green filter which was the first-color color filter, a thickness B (60 nm) of the flattening layer below the green filter, and a thickness C (560 nm) of the blue and red filters which were the second-color and third-color color filters satisfied the thicknesses defined in the present invention.

In Example 1-3, after the green filter which was the first-color color filter was cured by irradiation with ultraviolet light, the green filter was heat cured by high temperature heating. This is because when the content percentage of the pigment is high, even if the green filter is cured by photocuring, the green filter may be peeled off at a development step at which the photosensitive resin mask material used as the etching mask is patterned and a cleaning step at which the photosensitive resin mask material is removed after dry etching.

Due to the effect of the present example, the surface of the green pattern was cured with high density using the photosensitive component, and solvent resistance was improved even when the pigment concentration was high.
<Conventional Method>

On the basis of the conventional method described in Patent Literature 1, color filters of respective colors were formed by patterning by a photolithography process.

However, a thickness of the color filters of three colors, i.e., green, blue, and red, was set to 700 nm, which was small, and a lower layer flattening layer (60 nm) was provided below all the color filters of the respective colors.

Except for the above points, similarly to the first example, a solid-state image sensor was manufactured by the conventional method.
(Evaluation)

The examples in Example A differed from each other in the method of curing the first-color color filter. In the examples, the green filter had the thickness A (500 nm), the flattening layer below the green filter had the thickness B (60 nm), and the blue and red filters which were the second-color and third-color color filters had the thickness C (560 nm).

Intensities of a red signal, a green signal, and a blue signal of the solid-state image sensors of the respective examples were evaluated by comparing with intensities of a red signal, a green signal, and a blue signal of the solid-state image sensor produced by photolithography according to the conventional method so that the color filters of the three colors, i.e., green, blue, and red, had a thickness of 700 nm and had matching spectral characteristics.

Table 1 below shows evaluation results for the intensities of the signals of the respective colors.

TABLE 1

| | Detected signal intensity ratio (relative to conventional method) | | | |
|---|---|---|---|---|
| | Red | Green (next to Red) | Green (next to Blue) | Blue |
| Conventional method | 1.00 | 1.00 | 1.00 | 1.00 |
| Example 1-1 | 1.08 | 1.06 | 1.06 | 1.07 |
| Example 1-2 | 1.08 | 1.07 | 1.07 | 1.08 |
| Example 1-3 | 1.08 | 1.06 | 1.06 | 1.07 |

As shown in Table 1, in the solid-state image sensors of Examples 1-1 to 1-3 formed by the dry etching method so that the green filter had a smaller thickness and had good rectangularity, and the intensities of the signals of the respective colors were increased as compared with the solid-state image sensor formed by photolithography according to the conventional method.

Using the production method of the present example, the color filters were formed so that the thickness of the green filter, which was 500 nm, combined with the thickness (60 nm) of the flattening layer below the green filter was 560 nm, and the thickness of the red and blue filters was 560 nm. As compared with when all the color filters were formed by photolithography, the thicknesses of the color filters of the present example were reduced by 20%, and thus a distance from the top of the microlens to the device was reduced.

As a result of evaluating spectral characteristics after OCF formation by the production method of the present example, no change in the spectral characteristics were observed. This shows that the green filter having a smaller thickness obtained by the thermal curing and the photocuring of the present example had sufficient hardness. In order to achieve, by using the green filter having a smaller thickness, color spectral distribution equivalent to that of the green filter having the thickness (700 nm) formed by photolithography, the green filter material having a high content percentage of pigment was used, but no change occurred in the spectral characteristics. The effect of the thickness reduction reduced the distance from the top of the microlens to the device and increased the intensity of the green signal.

Furthermore, the thickness reduction reduced the probability that obliquely incident light passed through a color filter toward another color filter pattern, and the light traveling toward other color filter patterns was prevented from entering other photoelectric conversion elements. Accordingly, color mixture was reduced, and thus the signal intensity was increased.

Furthermore, since the flattening layer of the patterns of blue and red formed with good rectangularity was removed by etching, the distance from the top of the microlens to the device was reduced and the signal intensity was increased as compared with when the color filters were formed by photolithography.

Furthermore, also when the color filters were formed by the methods of Examples 1-1 to 1-3 so that the height of the second-color color filter 15 and the third-color color filter 16 had a value smaller than a value obtained by adding the thickness of the first-color color filter 14 to the thickness of the lower layer flattening layer 12, by increasing the content percentage of the pigment while reducing the thickness, the signal intensity was increased as compared with when the color filters were formed by photolithography according to the conventional method.

Example B

Next, Example B will be described.
Example B is an example based on the fourth embodiment.

Example 2-1

A solid-state image sensor of Example 2-1 was manufactured by the same method as Example 1-1, except for the following point.

Through the steps to the step of forming the third-color color filter, the color filters were formed so that the green filter which was the first-color color filter had a thickness A (500 nm), the flattening layer below the green filter had a thickness B (60 nm), and the second-color and third-color color filters which were the blue and red filters had a thickness C (700 nm) to satisfy the thicknesses defined in the fourth embodiment.

Next, on the color filters formed in the above process flow, a coating liquid containing an acrylic resin was spin coated at a rotational speed of 1000 rpm, and was heat treated at 200° C. for 30 minutes by means of a hot plate to cure the resin. Thus, an upper layer flattening layer was formed.

Finally, on the upper layer flattening layer, a microlens having a height from a lens top to a lens bottom of 500 nm was formed by the above-mentioned transfer method using etchback which is a publicly known technique. Thus, the solid-state image sensor of Example 2-1 was completed.

In the solid-state image sensor obtained as described above, the thin lower layer flattening layer was provided at the lower portion of the first-color color filter, and the second-color and third-color color filters were provided on the semiconductor substrate. Since the thermosetting resin and the small amount of photosensitive curable resin were used for the green filter which was the first-color color filter, a high pigment concentration in the solid content was achieved, and thus a color filter having a small thickness was formed. Furthermore, the photosensitive resin was used for the blue and red filters which were the second-color and third-color color filters. The second-color and third-color color filters were not formed to have a small thickness in conformity with the first-color color filter. By increasing the content of the photosensitive resin, the second-color and third-color color filters were formed to have a thickness that enables good pattern formation. However, since no lower layer flattening layer was provided at the lower portions of the second-color and third-color color filters, the total thickness was small, and a distance from the microlens to the light receiving element was short, as compared with the solid-state image sensor formed by the conventional method in which pattern formation was performed by photolithography.

Furthermore, the inside of the color filter material of the first-color color filter which was the green filter was cured by thermal curing, and further the surface of the color filter material of the first-color color filter was cured by exposure using the small amount of photosensitive resin. Accordingly, the color filter material of the first-color color filter had improved solvent resistance. When a green filter material having a high content percentage of pigment is used, the green filter material may react with a solvent or other color filter materials, and this may change spectral characteristics of the green filter material. Thus, the use of the thermal curing and the photocuring in combination improved hardness, and had an effect of preventing a change in the spectral characteristics.

Example 2-2

A solid-state image sensor of Example 2-2 was produced by a method similar to that of Example 1-2.

However, similarly to Example 2-1, also in Example 2-2, the color filters were formed so that the green filter which was the first-color color filter had a thickness A (500 nm), the flattening layer below the green filter had a thickness B (60 nm), and the blue and red filters which were the second-color and third-color color filters had a thickness C (700 nm).

Example 2-3

A solid-state image sensor of Example 2-3 was produced by a method similar to that of Example 1-3.

However, through the above steps, similarly to Example 2-1, also in Example 2-3, the color filters were formed so that the green filter which was the first-color color filter had a thickness A (500 nm), the flattening layer below the green filter had a thickness B (60 nm), and the blue and red filters which were the second-color and third-color color filters had a thickness C (700 nm).

During production, after the green filter which was the first-color color filter was cured by irradiation with ultraviolet light, the green filter was heat cured by high temperature heating. This is because when the content percentage of the pigment is high, even if the green filter is cured by photocuring, the green filter may be peeled off at a development step at which the photosensitive resin mask material used as the etching mask is patterned and a cleaning step at which the photosensitive resin mask material is removed after dry etching.

Due to the effect of the present example, the surface of the green pattern was cured with high density using the photosensitive component, and solvent resistance was improved even when the pigment concentration was high.

<Conventional Method>

On the basis of the conventional method described in Patent Literature 1, color filters of respective colors were formed by patterning by a photolithography process.

However, a thickness of the color filters of three colors, i.e., green, blue, and red, was set to 700 nm, which was small, and a lower layer flattening layer (60 nm) was provided below all the color filters of the respective colors.

Except for the above points, similarly to the first example, a solid-state image sensor was manufactured by the conventional method.

(Evaluation)

The examples in Example B differed from each other in the method of curing the first-color color filter. In the examples, the green filter had the thickness A (500 nm), the flattening layer below the green filter had the thickness B (60 nm), and the blue and red filters which were the second-color and third-color color filters had the thickness C (700 nm).

Intensities of a red signal, a green signal, and a blue signal of the solid-state image sensors of the respective examples were evaluated by comparing with intensities of a red signal, a green signal, and a blue signal of the solid-state image sensor produced by photolithography according to the conventional method so that the color filters of the three colors, i.e., green, blue, and red, had a thickness of 700 nm and had matching spectral characteristics.

Table 2 below shows evaluation results for the intensities of the signals of the respective colors.

TABLE 2

| | Detected signal intensity ratio (relative to conventional method) | | | |
|---|---|---|---|---|
| | Red | Green (next to Red) | Green (next to Blue) | Blue |
| Conventional method | 1.00 | 1.00 | 1.00 | 1.00 |
| Example 2-1 | 1.04 | 1.03 | 1.03 | 1.03 |
| Example 2-2 | 1.04 | 1.03 | 1.03 | 1.05 |
| Example 2-3 | 1.04 | 1.02 | 1.02 | 1.03 |

As shown in Table 2, in the solid-state image sensors of Examples 2-1 to 2-3 formed by the dry etching method so that the green filter had a smaller thickness and had good rectangularity, the intensities of the signals of the respective colors were increased as compared with the solid-state image sensor formed by photolithography which was the conventional method.

By the production method of the present example, the color filters were formed so that the thickness of the green filter, which was 500 nm, combined with the thickness (60 nm) of the flattening layer below the green filter was 560 nm, and the thickness of the red and blue filters was 700 nm. When all the color filters were formed by photolithography, the thickness of the red and blue filters combined with the thickness (60 nm) of the lower layer flattening layer was 760 nm. Accordingly, the thickness of the red and blue filters of the present example was reduced by the thickness (60 nm) of the flattening layer. In particular, the thickness reduction of the green filter yielded a large effect, and the distance from the top of the microlens to the device was reduced.

As a result of evaluating spectral characteristics after OCF formation by the production method of the present example, no change in the spectral characteristics were observed. This shows that the green filter having a smaller thickness obtained by the thermal curing and the photocuring of the present example had sufficient hardness. In order to achieve, by using the green filter having a smaller thickness, color spectral distribution equivalent to that of the green filter having the thickness (700 nm) formed by photolithography, the green filter material having a high content percentage of pigment was used, but no change occurred in the spectral characteristics. The effect of the thickness reduction reduced the distance from the top of the microlens to the device and increased the intensity of the green signal.

Furthermore, since the flattening layer of the patterns of blue and red formed with good rectangularity was removed by etching, the distance from the top of the microlens to the device was reduced and the signal intensity was increased as compared with when the color filters were formed by photolithography. The above results showed that even when a conventional color filter material having a low content percentage of pigment was used for the blue and red filters, the effect of the thickness reduction was easily obtained.

The present application addresses the following. The inventors have found that Patent Literatures 2 and 3 do not show a relationship between thicknesses of the color filters and that not all the color filters may have high sensitivity.

The present invention has an aspect of providing a high-definition solid-state image sensor which has good sensitivity and in which less color mixture occurs.

A solid-state image sensor which is an aspect of the present invention includes: a semiconductor substrate in which a plurality of photoelectric conversion elements are two-dimensionally arranged; a color filter layer which is provided on the semiconductor substrate and in which color filters of a plurality of colors are two-dimensionally arranged corresponding to the respective photoelectric conversion elements in a preset regular pattern; and a lower layer flattening layer that is provided in some cases and is arranged only between a first-color color filter of a first color selected from the plurality of colors and the semiconductor substrate, summarized in that: the following formulas (1) and (2) or the following formulas (1), (3), and (4) are satisfied, where A [nm] represents a thickness of the first-color color filter, B [nm] represents a thickness of the lower layer flattening layer, and C [nm] represents a thickness of color filters of colors other than the first color. The lower layer flattening layer may be omitted.

$$200\ [\text{nm}] \leq A \leq 700\ [\text{nm}] \quad (1)$$

$$C \leq A + 200\ [\text{nm}] \quad (2)$$

or $$200\ [\text{nm}] \leq A \leq 700\ [\text{nm}] \quad (1)$$

$$0\ [\text{nm}] \leq B \leq 200\ [\text{nm}] \quad (3)$$

$$C \leq A + B + 200\ [\text{nm}] \quad (4)$$

Furthermore, a method of manufacturing the solid-state image sensor which is an aspect of the present invention includes: a first step of forming the first-color color filter by forming the lower layer flattening layer on the semiconductor substrate, applying a coating liquid for the first-color color filter onto the lower layer flattening layer and curing the coating liquid to form the lower layer flattening layer and the color filter layer in this order, and then removing, by dry etching, a portion of the color filter layer other than a portion where the first-color color filter is to be arranged, and a portion of the lower layer flattening layer located below the portion of the color filter layer to be removed; and a second step of forming the color filters of the colors other than the first color by patterning by photolithography or dry etching after the first step.

The formation of the lower layer flattening layer may be omitted.

According to an aspect of the present invention, all the color filters can have a small thickness, and thus a total distance from a top of the microlens to the device can be made short. This makes it possible to provide a high-definition solid-state image sensor in which less color mixture occurs and all color filters arranged in pattern have high sensitivity.

The present invention has been described with embodiments. However, the scope of the present invention is not limited to the illustrative embodiments illustrated and described above, but also includes all embodiments that yield effects equivalent to the effects intended by the present invention. Furthermore, the scope of the present invention is not limited to combinations of features defined by the claims, but may be defined by any desired combination of specific features among all the disclosed features.

The entire description of Japanese Patent Application No. 2016-253556 (filed on Dec. 27, 2016) and Japanese Patent Application No. 2016-253650 (filed on Dec. 27, 2016) from which the present application claims the benefit of priority is incorporated herein by reference.

REFERENCE SIGNS LIST

10 . . . Semiconductor substrate
11 . . . Photoelectric conversion element
12 . . . Lower layer flattening layer
13 . . . Upper layer flattening layer
14 . . . First-color color filter
15 . . . Second-color color filter
16 . . . Third-color color filter
18 . . . Microlens
20 . . . Etching mask
20a . . . Photosensitive resin mask layer
20b . . . Opening
30 . . . Color filter layer Obviously, numerous modifications and variations of the present invention are possible in light of the above teachings. It is therefore to be understood that within the scope of the appended claims, the invention may be practiced otherwise than as specifically described herein.

What is claimed is:

1. A solid-state image sensor, comprising:
a semiconductor substrate having a plurality of photoelectric conversion elements being two-dimensionally formed therein;
a color filter layer formed on the semiconductor substrate and having color filters of a plurality of colors being two-dimensionally formed therein in a pattern such that the color filters correspond respectively to the photoelectric conversion elements,
wherein the color filter layer satisfies formulas (1) and (2):

$$200 \text{ nm} \leq A \leq 700 \text{ nm} \tag{1}$$

$$C \leq A + 200 \text{ nm} \tag{2}$$

where A represents a thickness in nm of a first-color color filter of a first color among the plurality of colors, C represents a thickness in nm of color filters of colors other than the first color, and A and C are different values; and
a lower layer flattening layer positioned directly on the semiconductor substrate and formed between the first-color color filter of the first color and the semiconductor substrate, and not between the color filters of the colors other than the first color and the semiconductor substrate.

2. The solid-state image sensor according to claim 1, wherein the lower layer flattening layer has a thickness B in nm which satisfies formulas (3) and (4):

$$0 \leq B \leq 200 \text{ nm} \tag{3}$$

$$C \leq A + B + 200 \text{ nm} \tag{4}$$

3. The solid-state image sensor according to claim wherein the color filter layer and the lower layer flattening layer satisfy formula (5):

$$A+B-200 \text{ [nm]} \leq C \leq A+B+200 \text{ [nm]} \tag{5}$$

4. A method of manufacturing the solid-state image sensor according to claim 3, comprising:
forming the lower layer flattening layer on the semiconductor substrate;
applying a coating liquid for the first-color color filter onto the lower layer flattening layer;
curing the coating liquid such that the color filter layer is formed on the lower layer flattening layer;
removing, by dry etching, a portion of the color filter layer other than a portion where the first-color color filter is to be formed, and a portion of the lower layer flattening layer below the portion of the color filter layer to be removed, such that the first-color color filter is formed; and
forming the color filters of the colors other than the first color by dry etching.

5. The method according to claim 4, wherein the curing is conducted at a heating temperature of 230° C.-270° C.

6. The solid-state image sensor according to claim 2, wherein the color filter layer and the lower layer flattening layer satisfy formulas (6) and (7):

$$0 < B \leq 200 \text{ nm} \tag{6}$$

$$A < C \leq A+B+200 \text{ nm} \tag{7}$$

7. The solid-state image sensor according to claim 6, wherein the first color is green,
the colors other than the first color include red, and
a thickness C of a red color filter is larger than a thickness (A+B).

8. A method of manufacturing the solid-state image sensor of claim 2, comprising:
forming the lower layer flattening layer on the semiconductor substrate;
applying a coating liquid for the first-color color filter onto the lower layer flattening layer;
curing the coating liquid such that the color filter layer is formed on the lower layer flattening layer;
removing, by dry etching, a portion of the color filter layer other than a portion where the first-color color filter is to be formed, and a portion of the lower layer flattening layer below the portion of the color filter layer to be removed, such that the first-color color filter is formed; and forming the color filters of the colors other than the first color by photolithography.

9. The method according to claim 8, wherein the curing is conducted at a heating temperature of 230° C.-270° C.

10. The solid-state image sensor according to claim 1, wherein the first-color color filter includes a thermosetting resin and a photocurable resin, and
the first-color color filter includes the thermosetting resin at a higher content than the photocurable resin.

11. The solid-state image sensor according to claim 1, wherein the first-color color filter includes a pigment at 50% by mass or more.

12. The solid-state image sensor according to claim 1, further comprising:
a plurality of microlenses formed two-dimensionally on the color filter layer such that the microlenses correspond respectively to the photoelectric conversion elements,
wherein each of the microlenses has a height from a lens top to a lens bottom of 400 nm-800 nm.

13. The solid-state image sensor according to claim 1, wherein, the first-color color filter occupies a largest area among the color filters.

14. A method of manufacturing a solid-state image sensor, the solid-state image sensor comprising:
a semiconductor substrate having a plurality of photoelectric conversion elements being two-dimensionally formed therein;
a color filter layer formed on the semiconductor substrate and having color filters of a plurality of colors being two-dimensionally formed therein in a pattern such that the color filters correspond respectively to the photoelectric conversion elements; and
a lower layer flattening layer positioned directly on the semiconductor substrate and formed between a first-color color filter of a first color among the plurality of colors and the semiconductor substrate, and not between color filters of colors other than the first color and the semiconductor substrate,
wherein the color filter layer satisfies formulas (1) and (2):

$$200 \text{ nm} \leq A \leq 700 \text{ nm} \quad (1)$$

$$C \leq A + 200 \text{ nm} \quad (2), \text{ and}$$

wherein the lower layer flattening layer has a thickness B in nm which satisfies formulas (3) and (4):

$$0 < B \leq 200 \text{ nm} \quad (3)$$

$$C \leq A + B + 200 \text{ nm} \quad (4)$$

where A represents a thickness in nm of the first-color color filter of the first color among the plurality of colors, C represents a thickness in nm of the color filters of the colors other than the first color, and A and C are different values, the method comprising:
forming the lower layer flattening layer on the semiconductor substrate;
applying a coating liquid for the first-color color filter onto the lower layer flattening layer;
curing the coating liquid such that the color filter layer is formed on the lower layer flattening layer;
removing, by dry etching, a portion of the color filter layer other than a portion where the first-color color filter is to be formed, and a portion of the lower layer flattening layer below the portion of the color filter layer to be removed, such that the first-color color filter is formed; and
forming the color filters of the colors other than the first color by photolithography.

* * * * *